United States Patent
Teramura et al.

(10) Patent No.: US 7,245,804 B2
(45) Date of Patent: Jul. 17, 2007

(54) LASER DEVICE AND EXPOSURE DEVICE USING THE SAME

(75) Inventors: Yuichi Teramura, Kanagawa (JP); Fusao Yamanaka, Kanagawa (JP); Yoji Okazaki, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 59 days.

(21) Appl. No.: 10/857,547

(22) Filed: Jun. 1, 2004

(65) Prior Publication Data
US 2004/0240489 A1 Dec. 2, 2004

(30) Foreign Application Priority Data
Jun. 2, 2003 (JP) .............................. 2003-156558

(51) Int. Cl.
G02B 6/26 (2006.01)
H01S 3/16 (2006.01)
H01S 5/00 (2006.01)

(52) U.S. Cl. .......................... 385/38; 372/43
(58) Field of Classification Search .................... None
See application file for complete search history.

(56) References Cited

U.S. PATENT DOCUMENTS 5,394,492 A 2/1995 Hwang
5,790,576 A * 8/1998 Waarts et al. ................. 372/43
6,188,814 B1 2/2001 Bhalla

FOREIGN PATENT DOCUMENTS

JP 2000-81533 A 3/2000
JP 2002-202442 A 7/2002
WO 98/47048 A1 10/1998

OTHER PUBLICATIONS

Jenny, Reinhard, Fundamentals of Fiber Optics, Apr. 26, 2000, www.volpiusa.com.*

* cited by examiner

Primary Examiner—Frank G. Font
Assistant Examiner—Erin D. Chiem
(74) Attorney, Agent, or Firm—Sughrue Mion, PLLC

(57) ABSTRACT

In a laser module, a laser beam which is emitted from a laser element is focused by a condensing optical system and caused to enter an incidence end of an optical fiber. A laser device is provided with a plurality of these laser modules. Emission end portions of the optical fibers are bundled to form a laser emission portion. A thickness of cladding h of each optical fiber is set to a value calculated in accordance with the following equation:

$$\text{cladding thickness } h \leq \left( \sqrt{\frac{\text{emission light amount of one laser module } W}{\text{required intensity } C \times \text{packing ratio } P}} - \text{core diameter } t \right) \div 2$$

As a result, it is possible to emit a laser-beam with a high intensity that is required for functionality as a laser light source, for the purpose of raising resolution of an exposure apparatus.

6 Claims, 16 Drawing Sheets

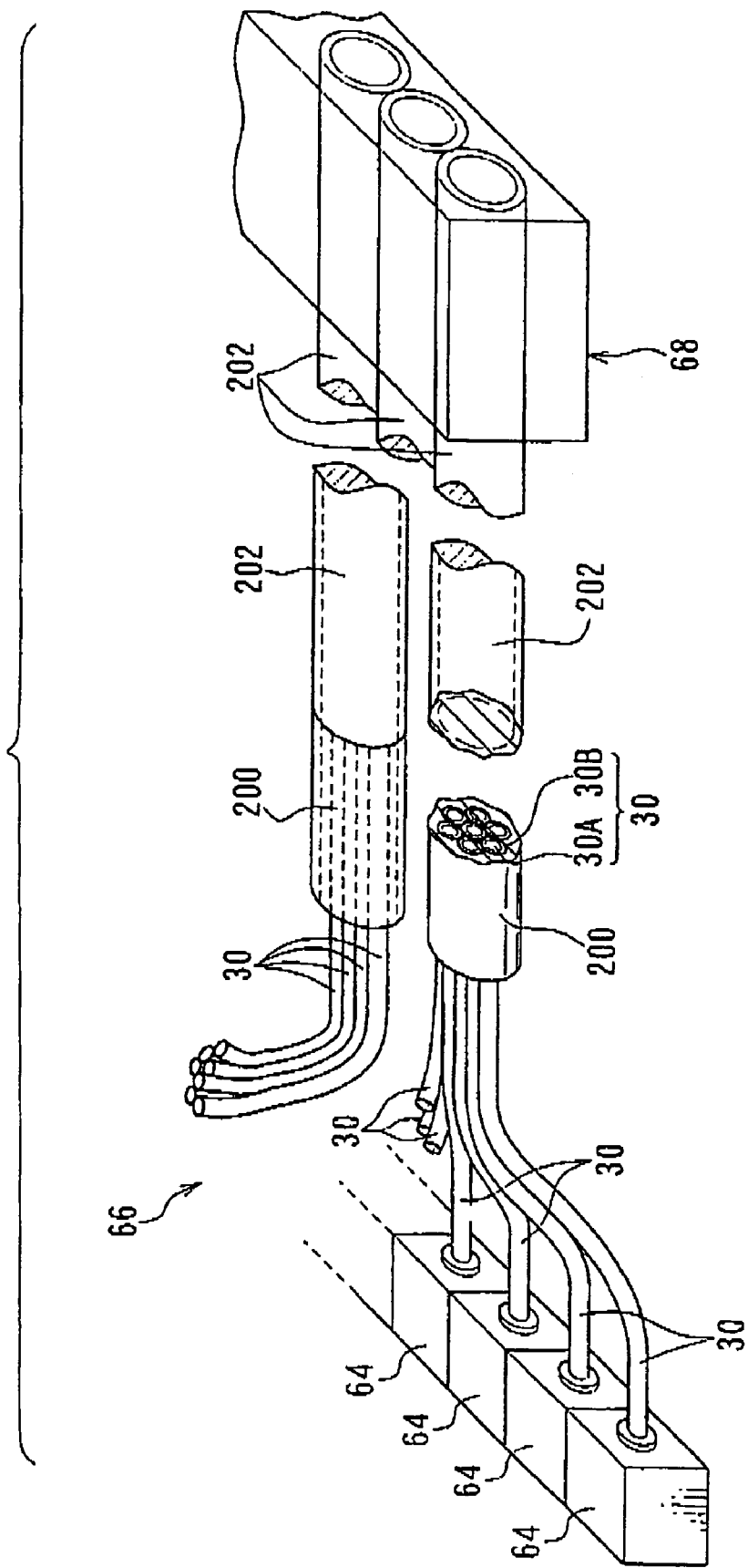

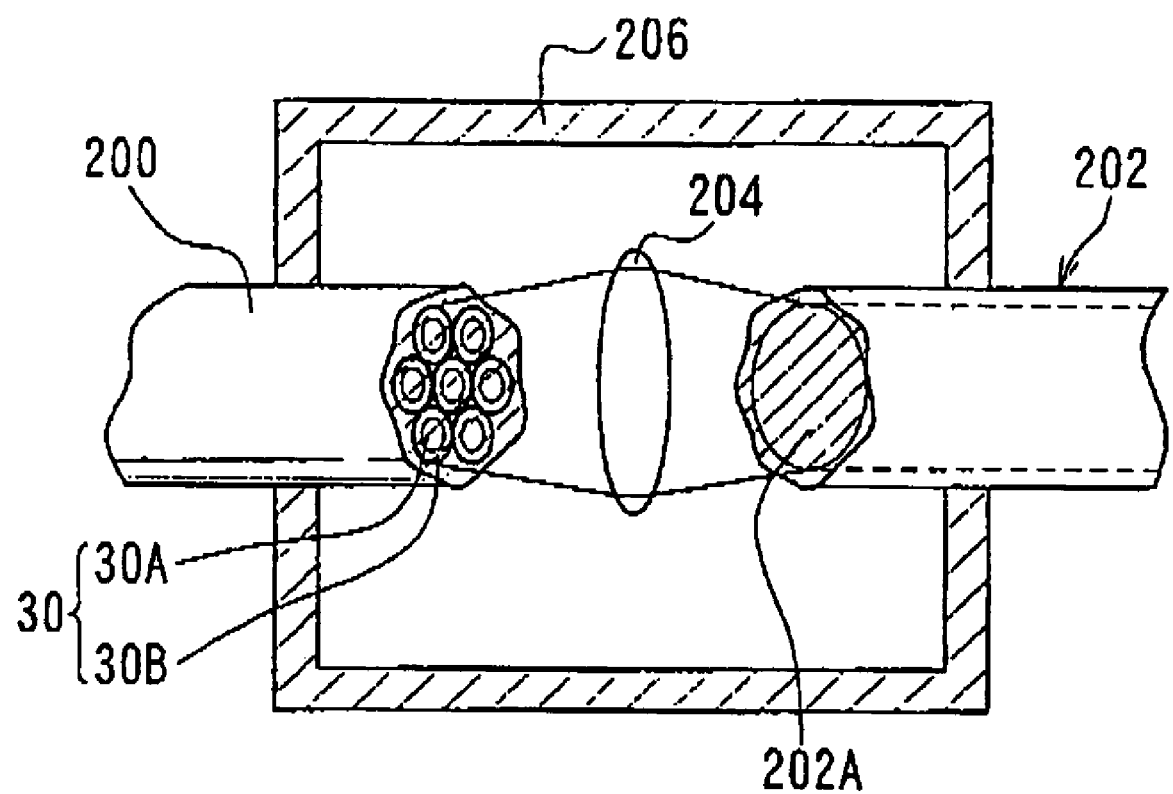
F I G. 10 B

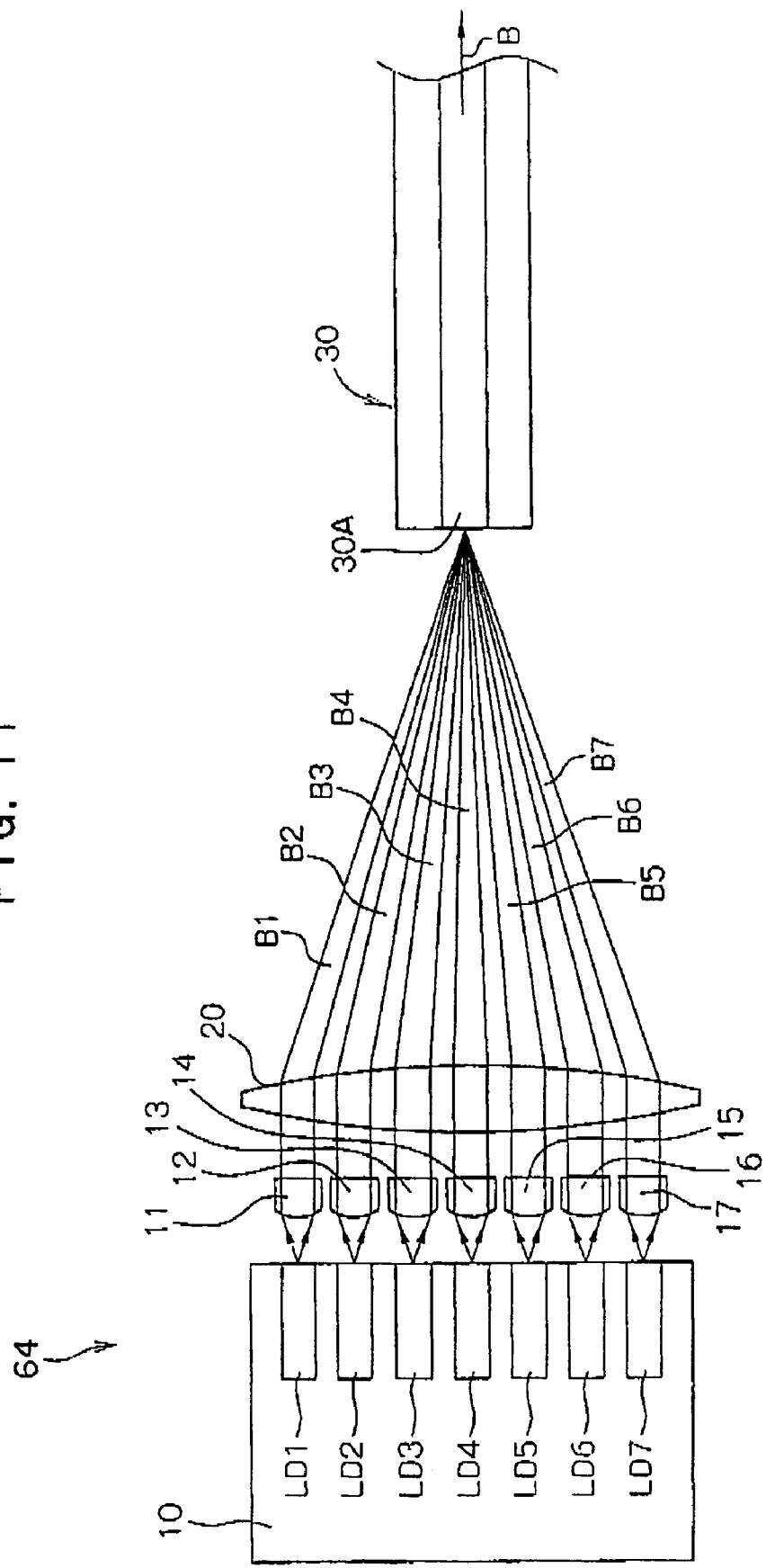

LASER DEVICE AND EXPOSURE DEVICE USING THE SAME

CROSS-REFERENCE TO RELATED APPLICATION

This application claims priority under 35 USC 119 from Japanese Patent Application No. 2003-156558, the disclosure of which is incorporated by reference herein.

BACKGROUND OF THE INVENTION

1. Field of the Invention

The present invention relates to a high-intensity laser device which is suitable for use as a laser light source of an exposure apparatus for exposing an exposure surface at a photosensitive material or the like with a laser beam which is spatially modulated by a spatial light modulation device in accordance with image data.

2. Description of the Related Art

Heretofore, an exposure apparatus which employs a spatial light modulation device such as a digital micromirror device (DMD) or the like for carrying out image exposure with light beams modulated in accordance with image data has been proposed in Japanese Patent Application No. 2002-149888, which is a prior application which has not yet been published.

A DMD thereof is structured as, for example, a mirror device in which numerous micromirrors, which alter angles of reflection surfaces thereof in accordance with control signals, are arranged two-dimensionally on a semiconductor support of silicon or the like.

An exposure apparatus which utilizes such a DMD is structured such that, for example, a laser beam emitted from a laser beam-emitting laser light source is collimated at a lens system, is reflected at the DMD, which is disposed substantially at a focusing position of the lens system, passes through an aperture, and is focused onto an exposure surface by another lens system.

In such an exposure apparatus, control signals are generated in accordance with image data or the like. Each of the micromirrors of the DMD is controlled to 'on' or 'off' by an unillustrated control device, on the basis of the control signals, to modulate (deflect) the laser beam. A portion of (light flux of) the laser beam is blocked by passing the modulated laser beam through apertures, and spot diameters of the laser beam are controlled to have a predetermined size at the exposure surface. In addition, the beam spots are formed with a shape of the beam spots (a spot shape) being a predetermined shape, and the beam spots are irradiated onto the exposure surface for exposing the same.

In this exposure apparatus, a photosensitive material (a photoresist or the like) is provided at a recording surface. The beam spots which are formed and projected by the apertures are irradiated onto the photosensitive material from an exposure head of the exposure apparatus. While positions of these beam spots are relatively moved with respect to the photosensitive material, the DMD is adjusted in accordance with the data. Thus, a process of pattern-exposure on the photosensitive material can be implemented.

For laser light which is emitted from laser devices which are employed at light sources of such exposure apparatuses, higher output is sought. Accordingly, as a laser device which is capable of emitting high-power laser light, a multiplex laser light source with a plurality of semiconductor laser elements and one multi-mode optical fiber, in which laser beams emitted from the plurality of semiconductor laser devices ate multiplexed at the multi-mode optical fiber, has been proposed (see, for example, Japanese Patent Application Laid-Open (JP-A) No. 2002-202442).

To provide a laser output that is required in an exposure apparatus, it is necessary to bundle a plurality of these multiplex laser light sources for use, Further, in order to perform high-precision imaging, it is required that a light source portion has high intensity. However, when these multiplex laser light sources, which conventionally have employed commonly-used fibers with a cladding diameter of 125 μm, are bundled, intensity is reduced by an amount corresponding to cladding regions, which do not contribute to light propagation, and the intensity is inadequate for the required intensity.

In order to structure a high-precision exposure system in which resolution is improved, with a conventional exposure apparatus as described above, a laser device which emits high-intensity laser light with a high power that is necessary for functionality as a high-precision exposure apparatus is called for.

SUMMARY OF THE INVENTION

In consideration of the circumstances described above, an object of the present invention is to provide a new laser device which is capable of emitting laser light of a high intensity which is required for raising precision of performance of an exposure apparatus.

A laser device of a first aspect of the present invention includes: laser elements; optical fibers each including cladding surrounding a core; and a laser emission portion at which emission end portions of a plurality of the optical fibers are arranged in the form of a bundle and integrated for emitting a single emission beam, the laser emission portion being provided with a plurality of laser modules that include condensing optical systems which focus laser beams emitted from the laser elements and cause the laser beams to enter through incidence ends of the optical fibers, wherein a thickness h of the cladding of each of the plurality of optical fibers is set to a value calculated in accordance with the following equation.

$$\text{cladding thickness } h \leq \left( \sqrt{\frac{\text{emission light amount of one laser module } W}{\text{required intensity } C \times \text{packing ratio } P}} - \text{core diameter } t \right) \div 2$$

When the laser device is structured as described above, etendue of emitted light which is provided from the laser emission portion, which is structured in a bundle, is reduced and high-intensity laser light is emitted from a small area. Thus, the laser device has higher intensity. Hence, a laser device can be structured which is capable of emitting a laser beam with a high intensity that is required for functionality as a laser light source for, for example, raising resolution in an exposure apparatus.

A laser device of a second aspect of the present invention includes: laser elements; optical fibers each including cladding surrounding a core; laser modules including condensing optical systems which focus laser beams emitted from the laser elements and cause the laser beams to enter through incidence ends of the optical fibers; a connective emission end portion at which a predetermined number of the optical fibers, which respectively lead out from the laser modules, are bundled to form a fiber bundle; a multiplex optical fiber, an incidence end of which is connected at the connective emission end portion, the multiplex optical fiber including a core with a diameter corresponding to an area which exceeds an area of the bundle that corresponds to a region of the plurality of bundled cores, such that laser beams that are emitted through the connective emission end portion are multiplexed, and the multiplex optical fiber including a numerical aperture equal to or greater than a numerical aperture of the optical fibers that lead out from the laser modules; and a laser emission portion at which emission end portions of a plurality of the multiplex optical fiber are bundled to form a fiber bundle.

When the laser device is structured as described above, it is possible, by using the multiplex optical fibers which have broad cladding diameters and high strength for extension, to extend over long distances, even in a case in which strength of the optical fibers that lead out from the laser modules has been lowered, because the cladding thickness h thereof has been reduced, and thus the optical fibers are inappropriate for guiding over long distances.

A laser device of a third aspect of the present invention further includes: a focusing lens and a housing, the housing including structure such that a multiplexed light beam that is emitted through the connective emission end portion, at which the plurality of optical fibers forms the fiber bundle, is focused by the focusing lens and caused to enter the core of the multiplex optical fiber, and the housing being structured in the form of a closed-structure container which encloses, all together, the connective emission end portion, the focusing lens and an incidence end portion of the multiplex optical fiber, a sealed atmosphere which includes an inactive gas being charged into the housing.

When the laser device is structured as described above, in addition to the operation and effects of the second aspect, the connective emission end portion, at which the plurality of optical fibers are fiber-bundled, can be connected with the incidence end portion of the multiplex optical fiber with the focusing lens interposed therebetween. In addition, the connective emission end portion, the incidence end portion of the multiplex optical fiber and the focusing lens, which are enclosed by the housing, are protected by the sealed atmosphere, which includes an inactive gas or the like and is charged into the housing, such that adherence of contaminants, such as components of organic materials that are decomposed by photochemical reactions, dust in the atmosphere and the like, and deterioration of laser characteristics is avoided.

A laser device of a fourth aspect of the present invention further includes: a first transparent member, which is disposed at an emission end face of the connective emission end portion, at which the plurality of optical fibers form the fiber bundle, for preventing adherence of contaminants and deterioration of laser characteristics; a second transparent member, which is disposed at a face of the incidence end of the multiplex optical fiber for preventing adherence of contaminants and deterioration of laser characteristics; and a focusing lens which is disposed between the first transparent member and the second transparent member such that a multiplexed light beam which, after being emitted from the emission end face of the connective emission end portion, has passed through the first transparent member passes through the second transparent member and enters the core of the multiplex optical fiber.

When the laser device is structured as described above, in addition to the operation and effects of the second aspect, the laser beam broadens while being transmitted from the emission end face of the connective emission end portion to an emission end face of the first transparent member, the laser beam diameter at the emission end face of the first transparent member is wider, and power density is reduced. As a result, adherence of contaminants, such as components of organic materials that are decomposed by photochemical reactions, dust in the atmosphere and the like, at the emission end face of the first transparent member and deterioration of laser characteristics can be avoided. Further, the diameter of the laser beam when focused by the focusing lens and incident at an incidence end face of the second transparent member widens and power density is reduced. As a result, adherence of contaminants, such as components of organic materials that are decomposed by photochemical reactions, dust in the atmosphere and the like, at the incidence end face of the second transparent member and deterioration of laser characteristics can be avoided.

Further, a fifth aspect of the present invention is an exposure device comprising: a laser device which emits a light beam for exposure, wherein the laser device comprises: laser elements; optical fibers each including cladding surrounding a core, and including an incidence end and an emission end portion; and a laser emission portion at which emission end portions of a plurality of the optical fibers are arranged in the form of a bundle and integrated for emitting a single emission beam, the laser emission portion being provided with a plurality of laser modules that include condensing optical systems which focus laser beams emitted from the laser elements and cause the laser beams to enter through incidence ends of the optical fibers, wherein a thickness h of the cladding of each of the plurality of optical fibers is set to a value calculated in accordance with the following equation:

$$\text{cladding thickness } h \leq \left( \sqrt{\frac{\text{emission light amount of one laser module } W}{\text{required packing}\times\text{ratio } P}} - \text{core diameter } t \right) \div 2;$$

a light modulation device at which a plurality of modulation elements, which respectively change light modulation states thereof, the spatial light modulation device being for modulating the light beam, which is emitted from the laser device and incident at the plurality of modulation elements, at each of the modulation elements; a microlens array at which a plurality of microlenses are arranged with a pitch corresponding to the plurality of modulation elements, the microlens array being for condensing light beams, which have been modulated by the modulation elements, at the respective microlenses; and a focusing optical system for focusing the light beams which have been condensed by the microlens array onto a surface to be exposed.

A sixth aspect of the present invention is an exposure device comprising: a laser device which emits a light beam for exposure, wherein the laser device comprises: laser elements; optical fibers each including cladding surrounding a core, and including an incidence end; laser modules including condensing optical systems which focus laser beams emitted from the laser elements and cause the laser beams to enter through incidence ends of the optical fibers; a plurality of connective emission end portions at each of which a predetermined number of the optical fibers, which respectively lead out from the laser modules, are bundled to form a fiber bundle; a plurality of multiplex optical fibers, an incidence end of each of which is connected at one of the connective emission end portions, the multiplex optical fiber including a core with a diameter corresponding to an area which exceeds an area of the bundle that corresponds to a region containing the cores of the plurality of bundled optical fibers, such that laser beams that are emitted through the connective emission end portion are multiplexed, and the multiplex optical fiber including a numerical aperture equal to or greater than a numerical aperture of the optical fibers that lead out from the laser modules; and a laser emission portion at which emission end portions of the plurality of multiplex optical fibers are bundled to form a fiber bundle; a light modulation device at which a plurality of modulation elements, which respectively change light modulation states thereof, the spatial light modulation device being for modulating the light beam, which is emitted from the laser device and incident at the plurality of modulation elements, at each of the modulation elements; a microlens array at which a plurality of microlenses are arranged with a pitch corresponding to the plurality of modulation elements, the microlens array being for condensing light beams, which have been modulated by the modulation elements, at the respective microlenses; and a focusing optical system for focusing the light beams which have been condensed by the microlens array onto a surface to be exposed.

BRIEF DESCRIPTION OF THE DRAWINGS

FIG. 10A is a perspective view of principal portions showing structure of a fiber light source which is used at the laser device relating to the embodiment of the invention.

FIG. 10B is an enlarged sectional view showing an example of structure at a connection portion between a connective emission end portion and a multiplex optical fiber for extension in a fiber light source which is used at the laser device relating to the embodiment of the invention.

FIG. 11 is a plan view showing structure of a multiplex laser light source which is used in the laser device relating to the embodiment of the invention.

DETAILED DESCRIPTION OF THE INVENTION

Below, an embodiment relating to a laser device of the present invention will be described in detail with reference to the drawings.

(Structure of Exposure Apparatus)

The laser device relating to the present embodiment is structured to be usable in an exposure apparatus which exposes an exposure surface, at a photosensitive material or the like, with a light beam which is spatially modulated by a spatial light modulation device in accordance with image data.

Figure 1:
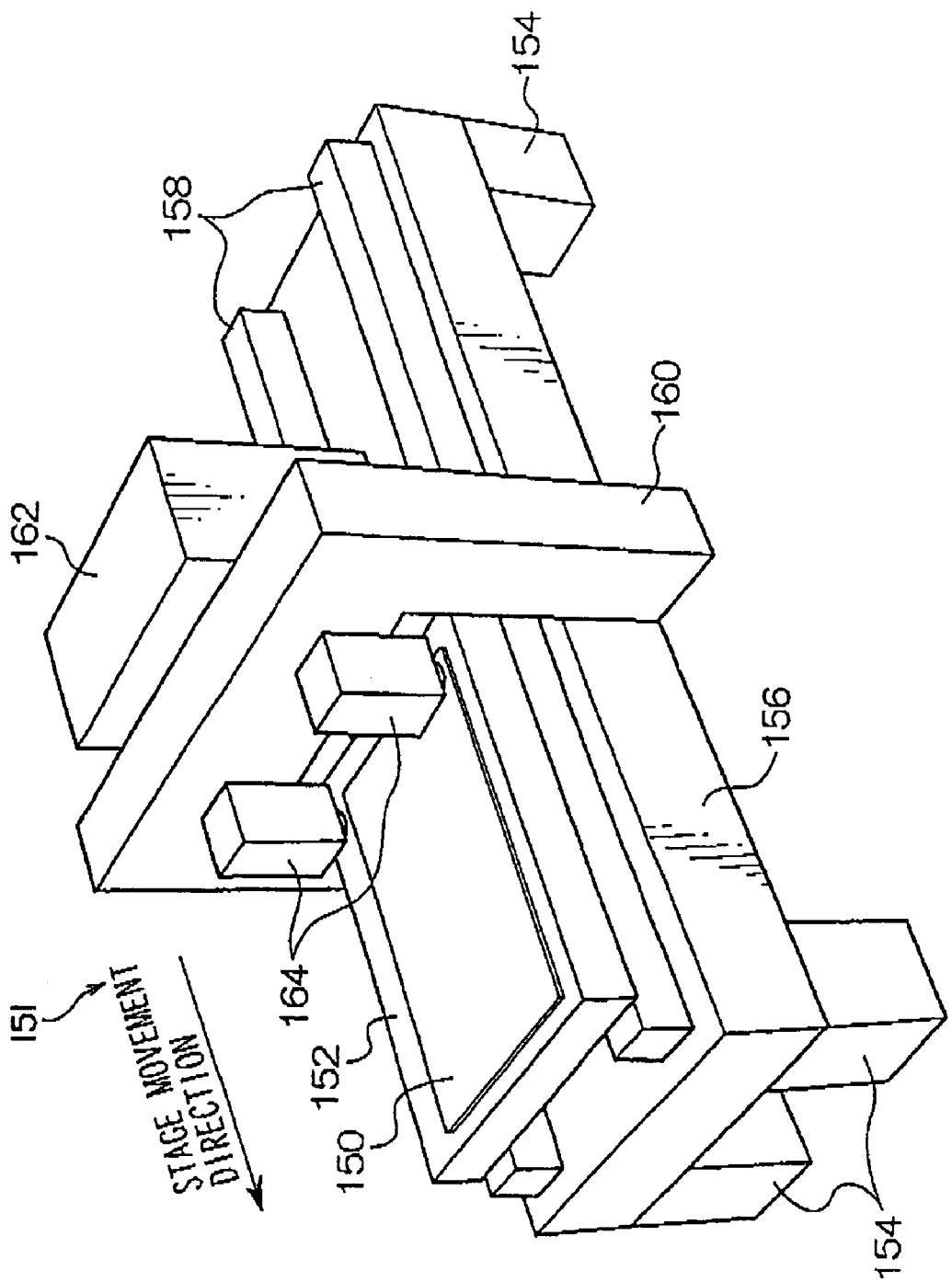
FIG. 1 is a perspective view showing the exterior of an exposure apparatus which is equipped with a laser device relating to an embodiment of the present invention.

As shown in FIG. 1, an exposure apparatus 151 is provided with a flat board-form stage 152, which attracts, by suction, and retains a sheet-form photosensitive material 150 at a surface thereof. Two guides 158, which extend in a stage movement direction, are provided at an upper face of a thick board-form equipment pedestal 156, which is supported at four leg portions 154. The stage 152 is disposed such that a longitudinal direction thereof is oriented in the stage movement direction, and is supported by the guides 158 so as to be reciprocally movable. At this exposure apparatus 151, an unillustrated driving apparatus is provided for driving the stage 152 along the guides 158.

At a central portion of the equipment pedestal 156, an 'n'-like gate 160 is provided so as to straddle a movement path of the stage 152. Respective end portions of the gate 160 are fixed at two side faces of the equipment pedestal 156. Sandwiching the gate 160, a scanner 162 is provided at one side and a plurality (for example, two) of detection sensors 164 are provided at the other side. The detection sensors 164 detect a leading end and a trailing end of the photosensitive material 150. The scanner 162 and the detection sensors 164 are respectively mounted at the gate 160, and are fixedly disposed upward of the movement path of the stage 152. The scanner 162 and detection sensors 164 are connected to an unillustrated controller which controls the scanner 162 and detection sensors 164.

Figure 2:
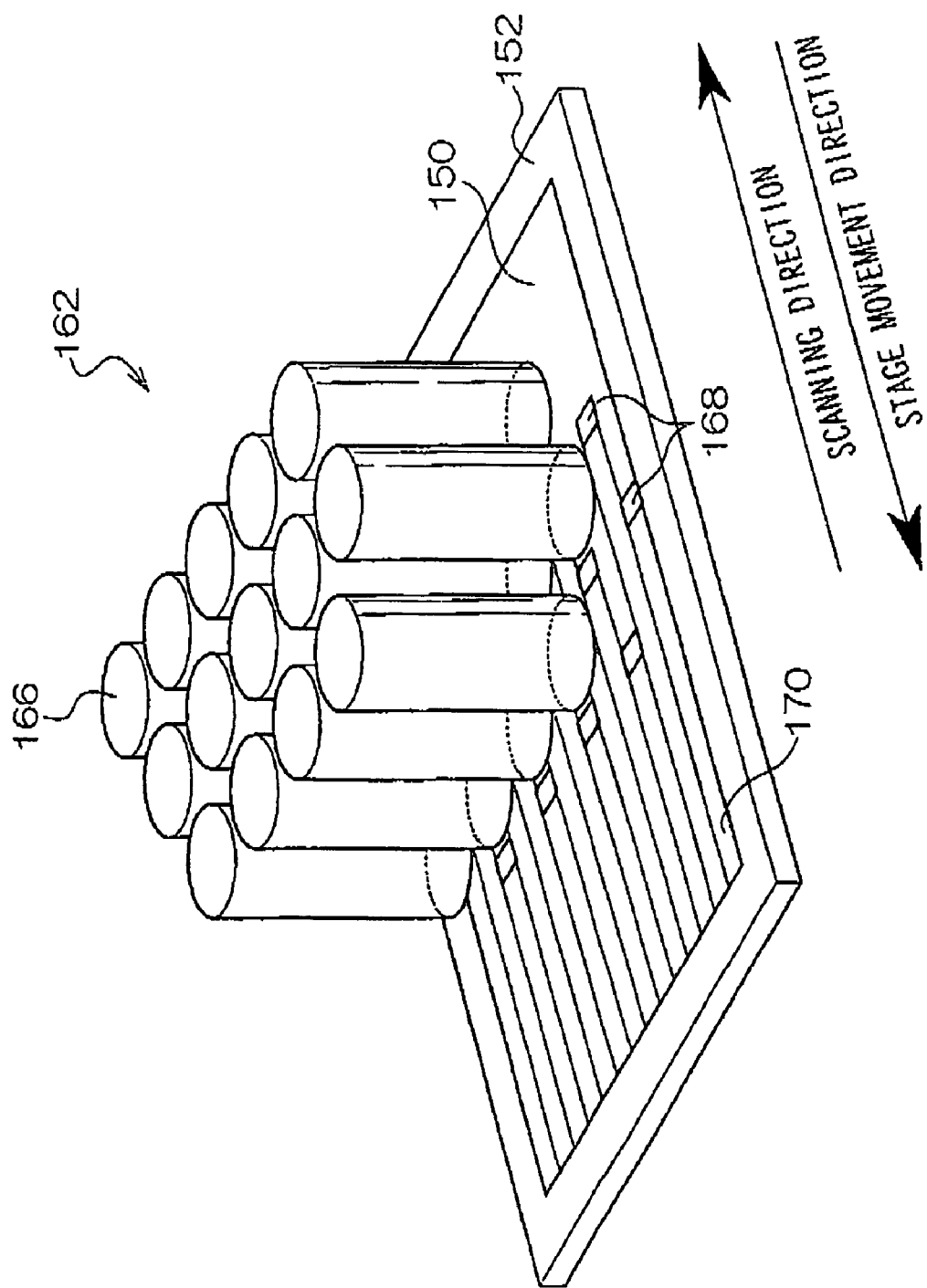
FIG. 2 is a perspective view showing structure of a scanner of the exposure apparatus equipped with the laser device relating to the embodiment of the present invention.
Figure 3A:
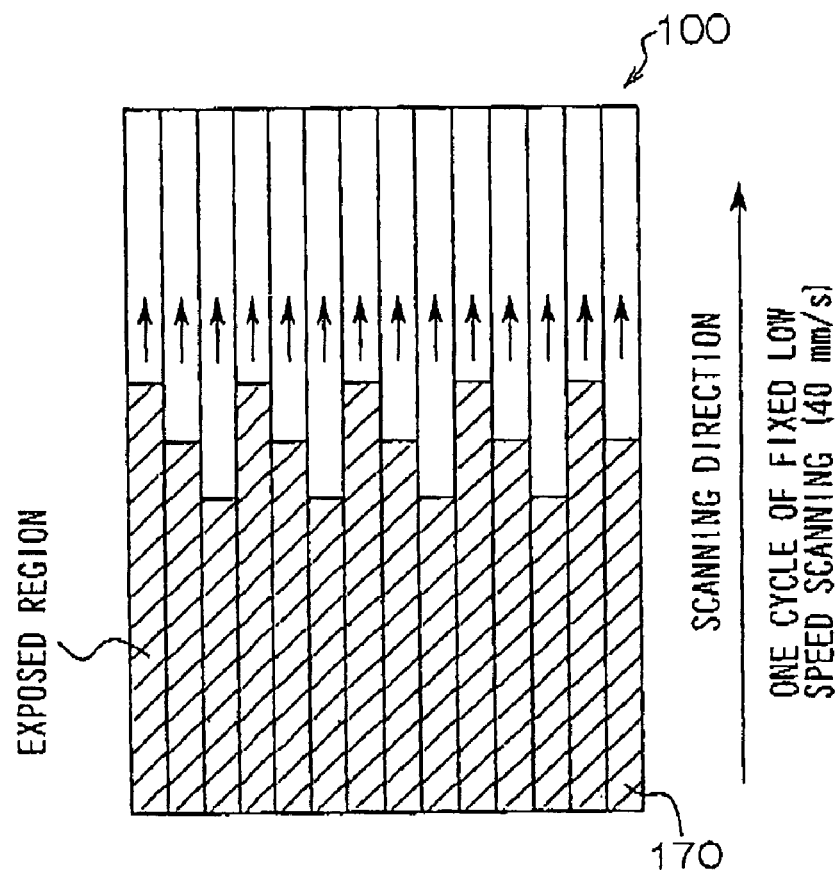
FIG. 3A is a plan view showing exposed regions formed on a photosensitive material at the exposure apparatus equipped with the laser device of the present invention.
Figure 3B:
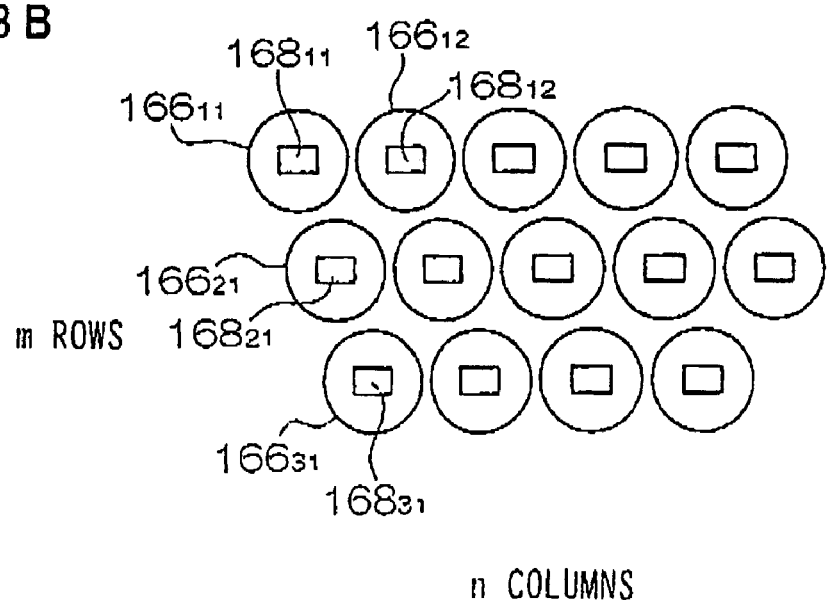
FIG. 3B is a view showing an arrangement of exposure areas due to respective exposure heads at the exposure apparatus equipped with the laser device of the present invention.

As shown in FIGS. 2 and 3B, the scanner 162 is equipped with a plurality (for example, fourteen) of exposure heads 166, which are arranged substantially in a matrix pattern with m rows and n columns (for example, three rows and five columns). In this example, in consideration of width of the photosensitive material 150, four of the exposure heads 166 are provided in the third row. Note that when an individual exposure head which is arranged in the m-th row and the n-th column is to be referred to, that exposure head is denoted as exposure head $166_{mn}$.

Exposure areas 168 covered by the exposure heads 166 have, for example, rectangular shapes with short sides thereof in a scanning direction. In such a case, in accordance with movement of the stage 152, band-form exposed regions 170 are formed on the photosensitive material 150 at the respective exposure heads 166. Note that when an exposure area that is formed by an individual exposure head, which is arranged in the m-th row and the n-th column, is to be referred to, that exposure area is denoted as exposure area $168_{mn}$.

As shown in FIGS. 3A and 3B, in each row, the respective exposure heads, which are arranged in a line, are disposed to be offset by a predetermined interval in a row arrangement direction (which interval is an integer multiple (two in the present embodiment) of the long dimension of tile exposure areas), such that the band-form exposed regions 170 will be lined up without gaps therebetween in a direction intersecting the scanning direction. Consequently, a portion that cannot be exposed between exposure area $168_{11}$ and exposure area $168_{12}$ of the first row can be exposed by exposure area $168_{21}$ of the second row and exposure area $168_{31}$ of the third row.

Figure 4:
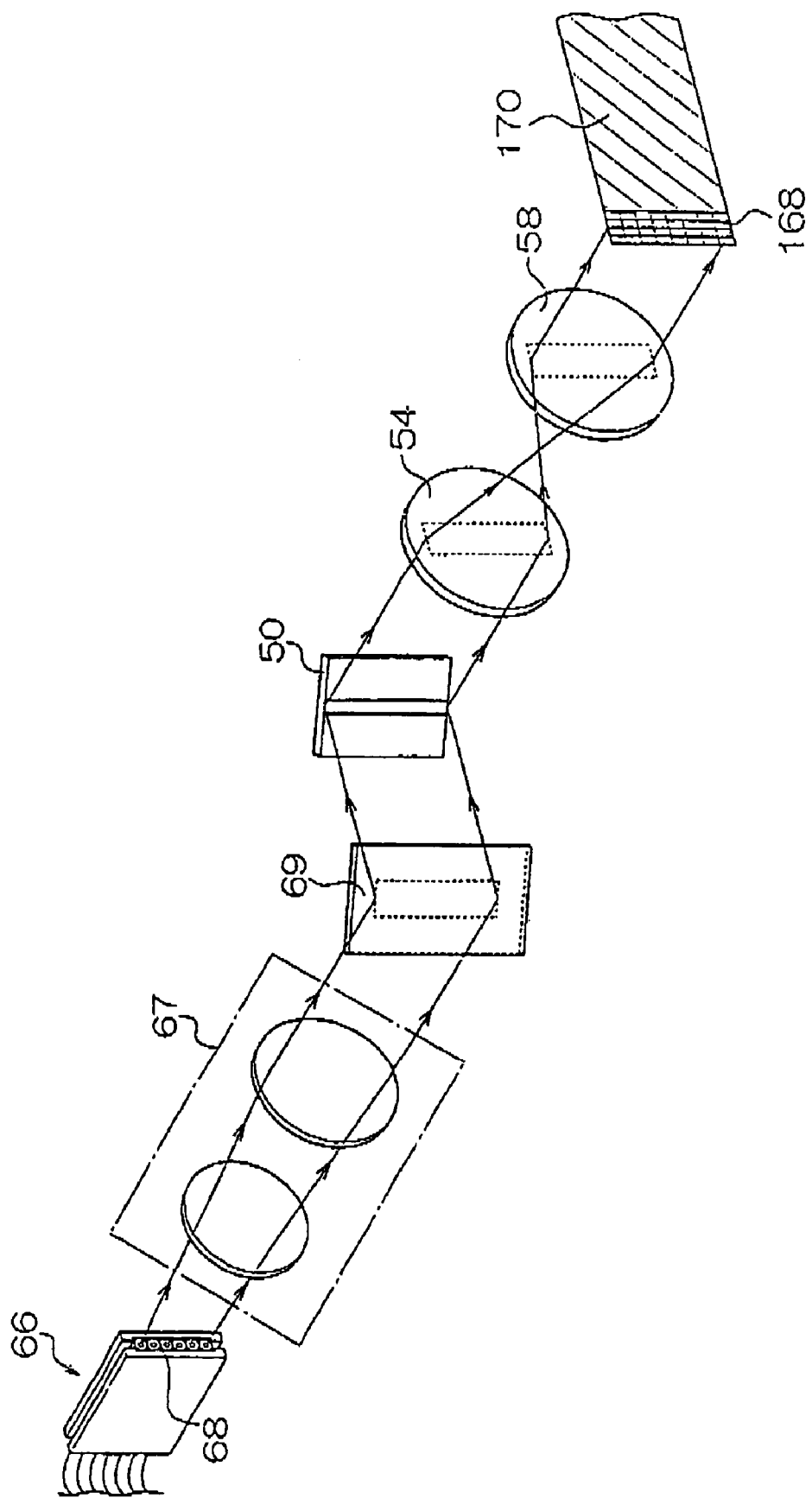
FIG. 4 is a perspective view showing general structure of an exposure head of the exposure apparatus equipped with the laser device relating to the embodiment of the present invention.
Figure 5:
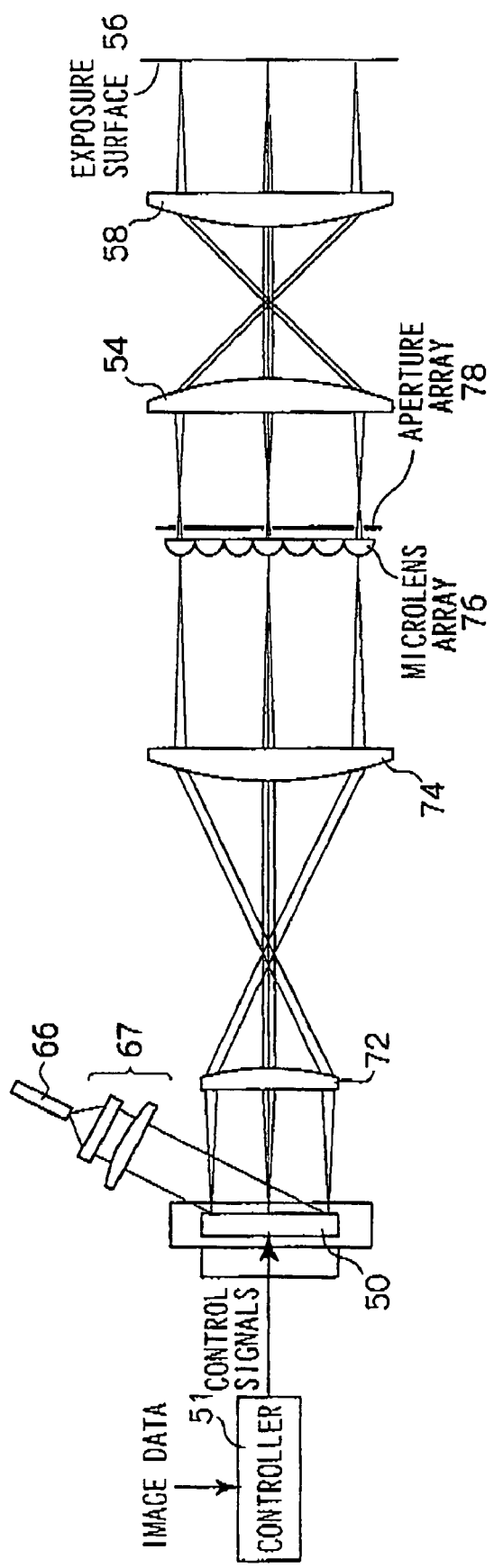
FIG. 5 is a side view showing general structure of the exposure head of the exposure apparatus equipped with the laser device relating to the embodiment of the present invention.

As shown in FIGS. 4 and 5, at each of the exposure heads $166_{11}$ to $166_{mn}$, a digital micromirror device (DMD) 50 is provided to serve as a spatial light modulation device for modulating incident light beams at respective pixels in accordance with image data. The DMD 50 is connected with a controller 51, which is provided with a data processing section and a mirror driving control section.

This controller 51 is structured by a computer which, although not illustrated, is provided with a CPU, data storage devices such as a ROM and a RAM, input/output devices such as a monitor, a keyboard and the like, and the like.

A light source 66, at a light incidence side of the DMD 50, illuminates the DMD 50. A lens system 67 is also provided. The lens system 67 corrects laser light which is emitted from the light source 66, and focuses the light on the DMD 50.

Lens systems 72 and 74, which magnify a DMD image that has been reflected at the DMD 50, are provided at a light reflection side of the DMD 50.

A microlens array 76 is disposed at a position at which the DMD image is focused by the lens systems 72 and 74. At the microlens array 76, microlenses are provided in correspondence with the respective pixels of the DMD. An aperture array 78 is disposed at a light emission side of the microlens array 76. Lens systems 54 and 58 are disposed at a light emission side of this aperture array 78 such that the DMD 50 and an exposure surface 56 have a conjugative relationship.

At this exposure apparatus 151, when image data is inputted to the controller 51, driving signals are generated for driving control of each micromirror of the DMD 50 on the basis of the inputted image data. Angles of reflection surfaces of the respective micromirrors of the DMD 50 are controlled in accordance with the generated control signals.

Light that is irradiated from the light source 66 through the lens system 67 to the DMD 50 is reflected in predetermined directions in accordance with the angles of the reflection surfaces of the respective micromirrors, and is thus modulated. The modulated light is magnified by the lens systems 72 and 74. As a result, a size on the exposure surface 56 of spots corresponding to pixels of the DMD 50 is magnified, and a pitch of these pixel spots is magnified.

The light that has been magnified by the lens systems 72 and 74 enters the respective microlenses that are provided at the microlens array 76, and the magnified DMD images are shrunk again. Here, because all light flux enters the microlens array 76, light usage efficiency is not reduced.

The light that has been focused by the microlens array 76 passes through the respective apertures provided at the aperture array 78 and enters the lens systems 54 and 58 and an image of the DMD 50 is focused at the exposure surface 56 by the lens systems 54 and 58. Note that the occurrence of ghost images due to stray light is prevented by the light passing through these apertures.

Figure 6:
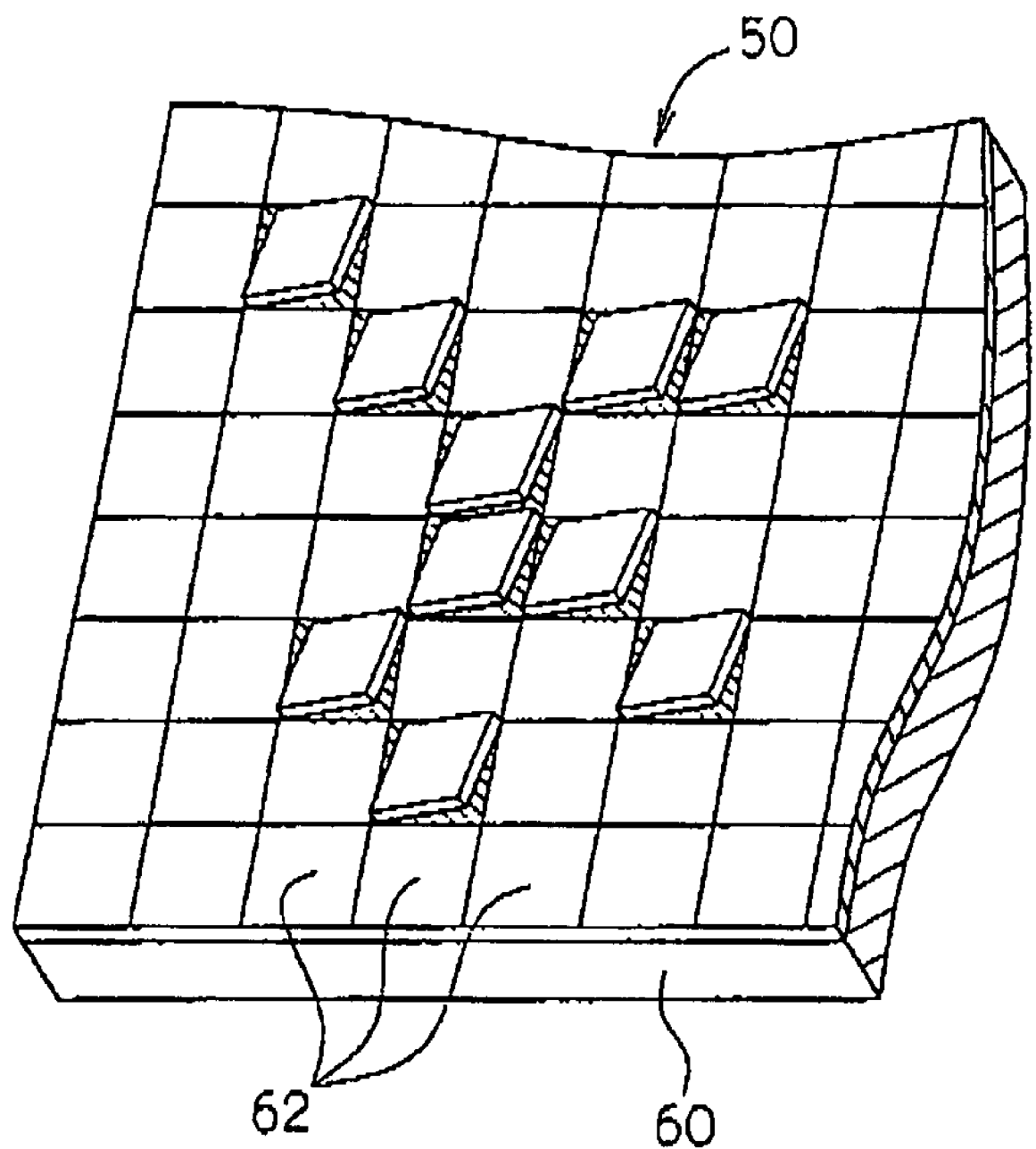
FIG. 6 is a partial enlarged view showing structure of a digital micromirror device (DMD) used in the exposure apparatus equipped with the laser device relating to the embodiment of the present invention.
Figure 7A:
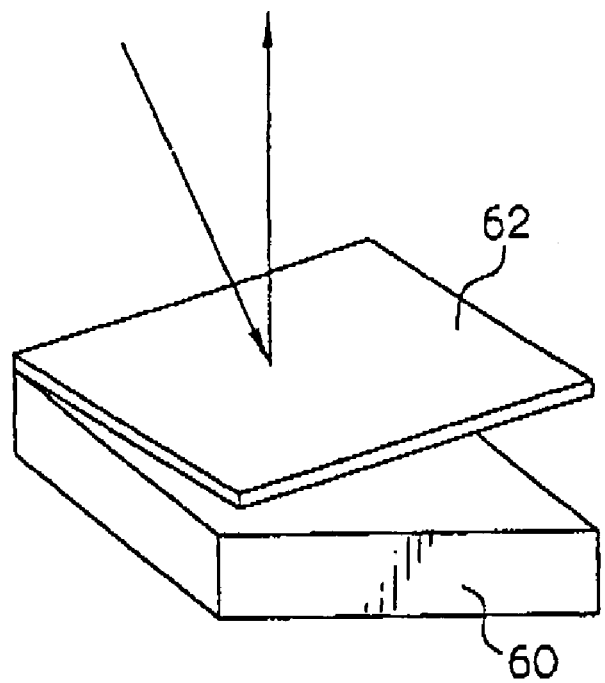
FIG. 7A is an explanatory view for explaining operation of the DMD used in the exposure apparatus equipped with the laser device relating to the embodiment of the present invention.
Figure 7B:
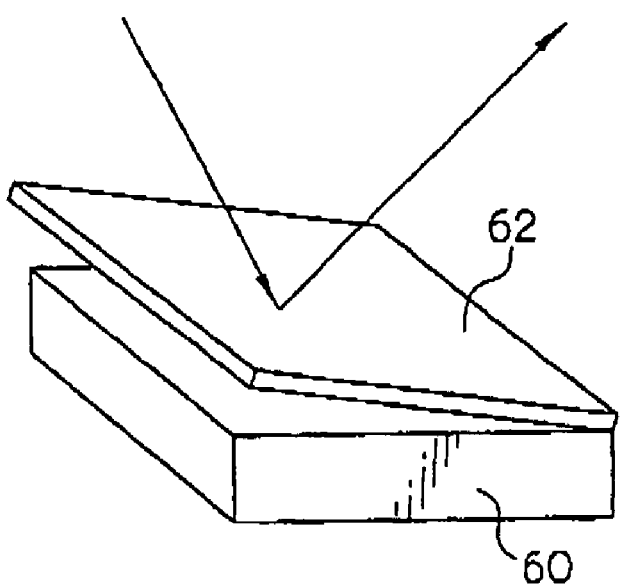
FIG. 7B is an explanatory view for explaining operation of the DMD used in the exposure apparatus equipped with the laser device relating to the embodiment of the present invention.

As shown in FIG. 6, at the DMD 50, very small mirrors (micromirrors) 62, which are supported by support pillars, are disposed on an SRAM cell (memory cell) 60. The DMD 50 is a mirror device which is structured with a large number (for example, 600 by 800) of these extremely small mirrors, which structure image elements (pixels), arranged in a checkerboard pattern. At each pixel, as shown in FIGS. 7A and 7B, the micromirror 62 is provided so as to be supported at an uppermost portion of the support pillar. A material with high reflectivity, such as aluminium or the like, is applied by vapor deposition at the surface of the micromirror 62.

The reflectivity of the micromirror 62 is at least 90%. The SRAM cell 60, which is fabricated with CMOS silicon gates by a continuous semiconductor memory production line, is disposed directly under the micromirror 62, with the support pillar, which includes a hinge and a yoke, interposed therebetween. The whole of this structure is monolithic (integrated).

When digital signals are written to the SRAM cell 60 of the DMD 50, the micromirrors 62 supported at the support pillars are inclined, about a diagonal, in a range of $\pm\alpha°$ (for example, $\pm10°$), relative to the side of the support at which the DMD 50 is disposed. FIG. 7A shows a state in which the micromirror 62 is inclined at $+\alpha°$, which is an 'ON' state, and FIG. 7B shows a state in which the micromirror 62 is inclined at $-\alpha°$, which is an 'OFF' state. Accordingly, as a result of control of the inclinations of the micromirrors 62 at the pixels of the DMD 50 in accordance with image signals, as shown in FIG. 6, the light that is incident at the DMD 50 is reflected in directions of inclination of the respective micromirrors 62.

FIG. 6 shows a portion of the DMD 50 enlarged, and shows an example of a state in which the micromirrors 62 are controlled to $+\alpha°$ and $-\alpha°$. The ON-OFF control of the respective micromirrors 62 is carried out by the controller 51 connected to the DMD 50. Light that is reflected by the micromirrors 62 in the ON state is modulated to an exposing state and enters a projecting optical system which is provided at the light emission side of the DMD 50, as is shown in FIG. 5. Light that is reflected by the micromirrors 62 in the OFF state is modulated to a non-exposing state and enters a light-absorbing body (not shown).

Figure 8A:
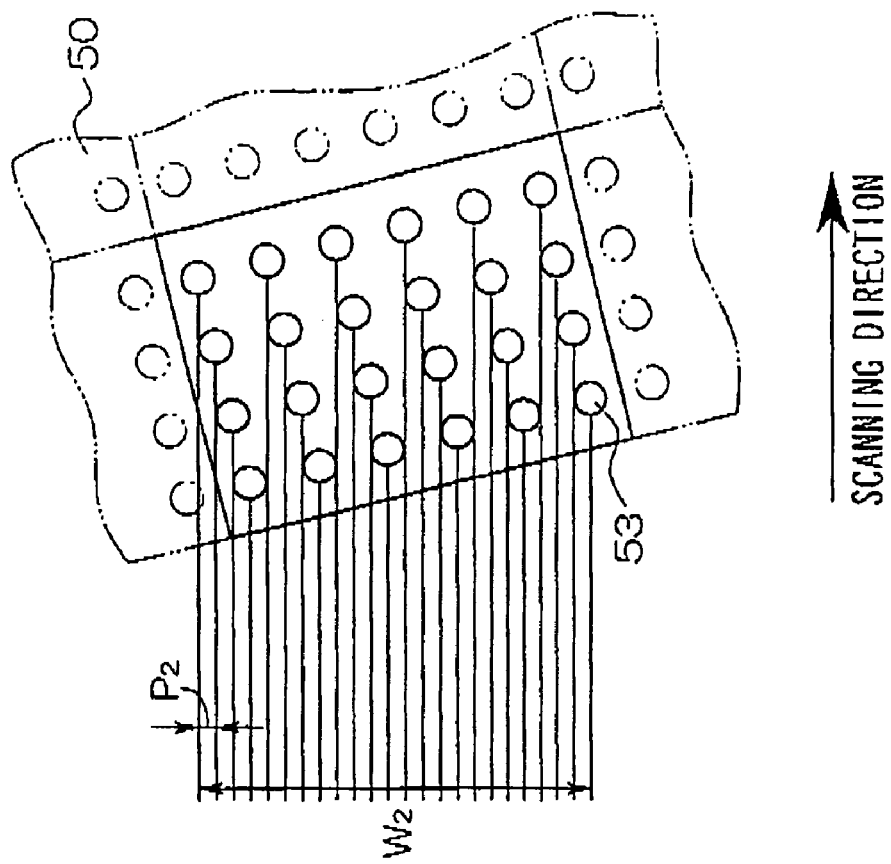
FIG. 8A is a plan view showing positions of exposure beams and scanning lines for comparison between a case in which the DMD used in the exposure apparatus equipped with the laser device relating to the embodiment of the present invention is not disposed at an angle and a case of angled disposition.
Figure 8B:
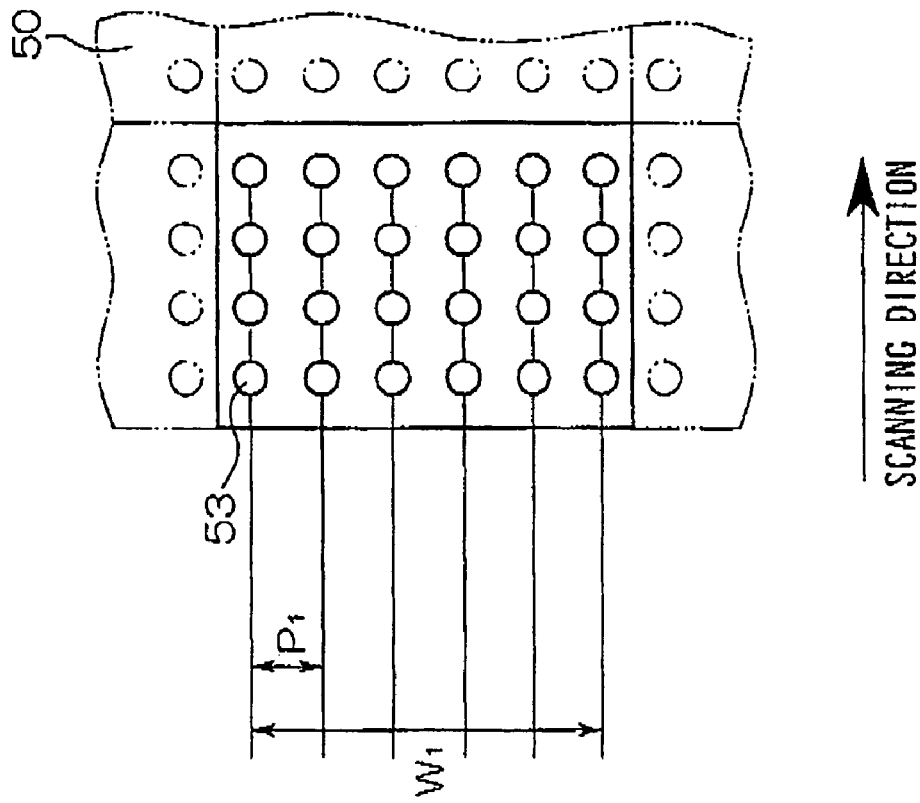
FIG. 8B is a plan view showing positions of exposure beams and scanning lines for comparison between the case in which the DMD used in the exposure apparatus equipped with the laser device relating to the embodiment of the invention is not disposed at an angle and the case of angled disposition.

It is preferable if the DMD 50 is disposed to be slightly inclined, such that a short side thereof forms a predetermined angle θ (for example, 1° to 5°) with the scanning direction. FIG. 8A shows scanning tracks of reflection images (exposure beams) 53 formed by the micromirrors in a case in which the DMD 50 is not inclined. FIG. 8B shows scanning tracks of the exposure beams 53 in a case in which the DMD 50 is inclined.

At the DMD 50, a large number (for example, 800) of micromirrors are arranged in a long side direction (a row direction) to form a micromirror row, and a large number (for example, 600) of these micromirror rows are arranged in a short side direction. As shown in FIG. 8B, when the DMD 50 is inclined, a pitch P2 of scanning paths (scanning lines) of the exposure beams 53 from the micromirrors is tighter than a pitch P1 of scanning lines in the case in which the DMD 50 is not inclined. Thus, resolution can be greatly improved. However, because the angle of inclination of the DMD 50 is very small, a scanning width W2 in the case in which the DMD 50 is inclined is substantially the same as a scanning width W1 in the case in which the DMD 50 is not inclined.

Hence, substantially the same positions of the same scanning lines (dots) will be superposingly exposed by different micromirror rows (multiple exposure). As a consequence of this multiple exposure, exposure positions can be controlled in very fine amounts, and high-precision exposure can be implemented. Further, by control in very fine amounts of exposure positions at boundary lines between the plurality of exposure heads arranged in the direction intersecting the scanning direction, joins without steps can be formed.

Instead of inclining the DMD 50, the micromirrors may be disposed in a staggered pattern in which the micromirror rows are shifted by predetermined intervals in the direction intersecting the scanning direction, and the same effects can be obtained.

(Structure of High-Intensity Laser Device)

Figure 9A:
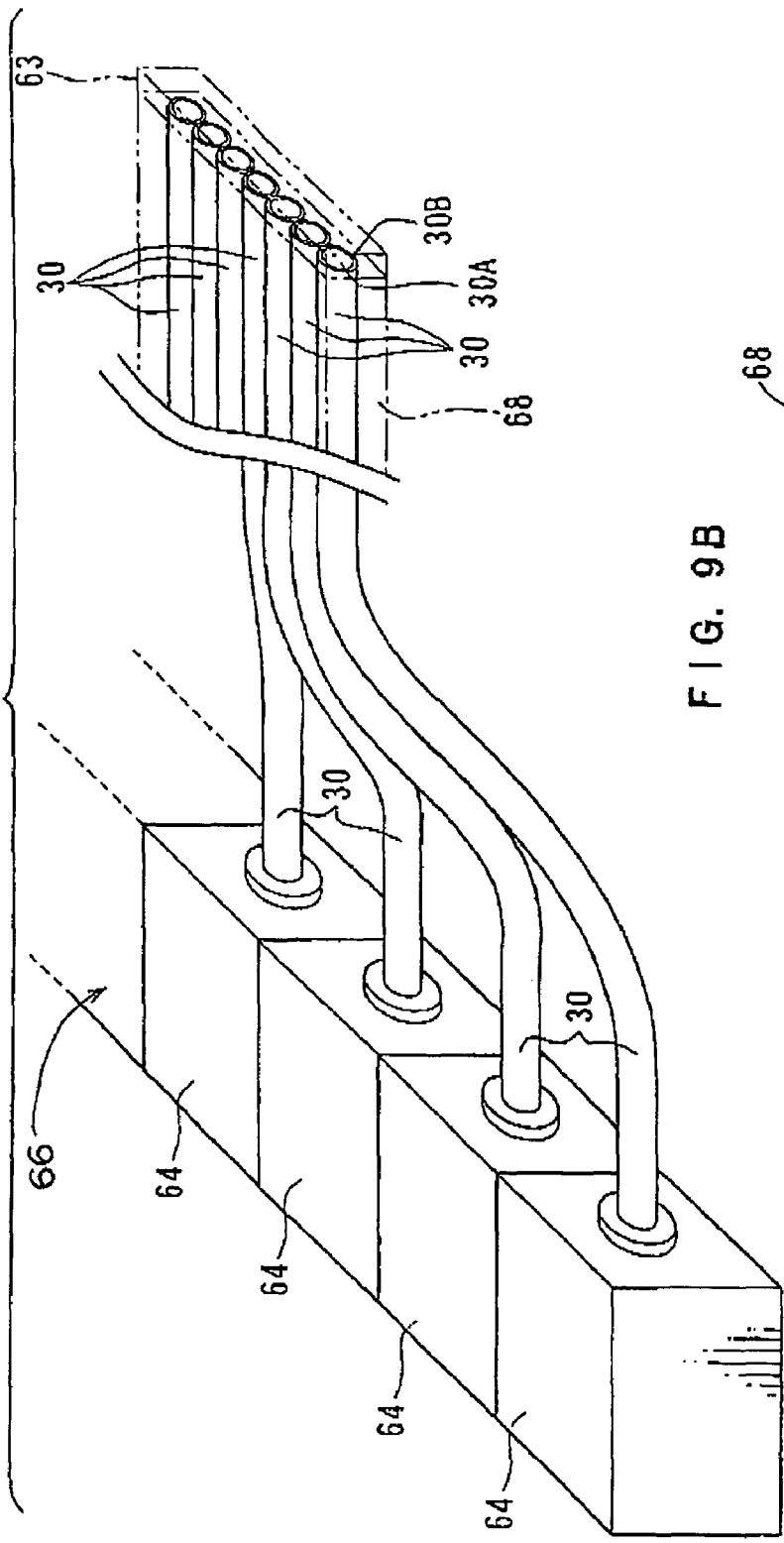
FIG. 9A is a perspective view showing structure of a fiber light source which is used in the exposure apparatus equipped with the laser device relating to the embodiment of the invention.

As shown in, for example, FIG. 9A, the fiber light source 66 is equipped with a plurality (for example, twenty-five) of "pigtail"-type laser modules 64. From each laser module 64, an optical fiber 30 is led out. In a case in which a plurality of single-mode laser diodes, a multi-mode laser diode or the like is employed, a multi-mode optical fiber is used for the optical fiber 30. In a case in which a single single-mode laser diode is employed, a single-mode optical fiber may be used as the optical fiber 30.

Figure 9B:
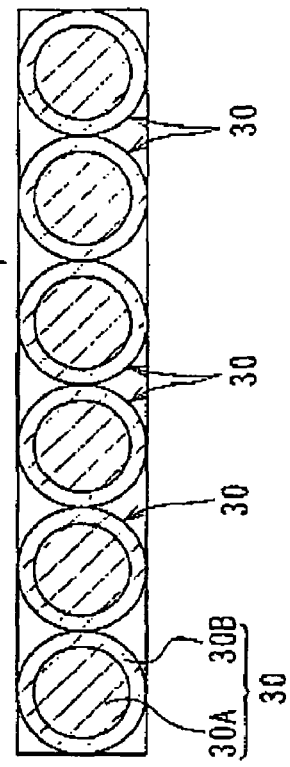
FIG. 9B is a front view showing an arrangement of light emission points at a laser emission portion.

As shown in FIGS. 9A and 9B, at end portions of this plurality of optical fibers 30 leading out from the respective laser modules 64, emission end portions of the optical fibers 30 (light emission points) are arranged in a single row, without gaps, along the direction intersecting the scanning direction and bundled to structure a laser emission portion 68. Note that the light emission points could be bundled so as to be arranged in two rows along the direction intersecting the scanning direction.

This arrangement in which the emission end portions of the optical fibers 30 are bundled is, as described later, determined in accordance with a spot shape of beam spots that are projected at the exposure surface 56.

When this plurality of emission end portions of the optical fibers 30 is bundled, integration of the plurality of emission end portions of the optical fibers 30 into a rectangular form may be implemented by fusion with glass or fixing with solder. Further, the plurality of emission end portions of the optical fibers 30 may be integrated by being sandwiched between two rectangular flat plates.

Furthermore, a transparent protective plate 63, of glass or the like, is disposed at the light emission side of the bundled plurality of optical fibers 30 in order to protect end faces of the optical fibers 30. The protective plate 63 may be disposed to be closely contacted with the end faces of the optical fibers 30, and further, may be disposed such that the end faces of the optical fibers 30 are sealed in an inactive gas such as nitrogen gas or the like, or an inactive gas including a small amount of oxygen gas.

The emission end portions of the optical fibers 30 emit laser light with high optical density, tend to attract dust, and are susceptible to deterioration. When these emission end portions are protected by the provision of the protective plate 63, accumulation of dust at the end faces can be prevented and deterioration can be slowed.

At the optical fibers 30, any of step index type optical fibers, graded index-type optical fibers and multiplex-type optical fibers can be used. For example, a step index-type optical fiber produced by Mitsubishi Cable Industries, Ltd. may be used. In the present embodiment, the optical fibers 30 are step index-type optical fibers.

The optical fibers 30 that are employed may have, for example, cladding diameter=60 μm, core diameter=50 μm and NA=0.2.

Commonly, with laser light in the infrared region, propagation losses increase as the cladding diameter of an optical fiber becomes smaller. Accordingly, suitable cladding diameters are determined in accordance with a wavelength range of laser light. However, the shorter the wavelength, the smaller the propagation losses. Hence, with laser light with a wavelength of 405 nm, as emitted from a GaN-based semiconductor laser, propagation losses are barely increased at all when a cladding thickness ((cladding diameter−core diameter)/2) is set to around half a cladding thickness for a case of propagating infrared light in an 800 nm wavelength region or around a quarter of a cladding thickness for a case of propagating infrared light in a 1.5 μm wavelength region, the latter of which is used for communications. Therefore, the cladding diameter can be reduced to 60 μm.

The cladding diameter of the optical fibers 30 is not limited to 60 μm. An optical fiber which is employed in a conventional fiber light source has a cladding diameter of 125 μm. However, because focusing depth becomes deeper as the cladding diameter becomes smaller, it is preferable if the cladding diameter of these multi-mode optical fibers is 80 μm or less, more preferably 60 μm or less, and even more preferably 40 μm or less. On the other hand, given that the core diameter needs to be at least 3 to 4 μm, it is preferable that the cladding diameter of the optical fiber 30 is at least 10 μm.

Thus, at the light source 66, which serves as a high-intensity laser device, laser light is emitted from the laser emission portion 68 which is structured by bundling the end portions of the optical fibers 30 that lead out from each of the plurality of laser modules 64. Next, a technique for setting intensity of this laser light to a high intensity, which is needed for performance that is required of the exposure heads 166 of the exposure apparatus 151, will be described.

Reducing etendue (numerical aperture×area of a light emission region) is effective for increasing resolution at the exposure apparatus 151. Accordingly, in order to implement a high resolution that is required for functionality of the exposure apparatus 151, it is necessary to enable the emission of higher intensity laser light by reducing, by a required area amount, the area of a light emission region of the laser emission portion 68, which region is structured by bundling the end portions of the plurality of optical fibers 30 that lead out from each of the plurality of laser modules 64.

Further, as a technique for reducing the area of the light emission region of the bundled laser emission portion 68 by the required area, there is a technique in which an area that cladding 30B encompasses is reduced by a portion corresponding to the required area. The cladding 30B is provided around a core 30A of the optical fiber 30.

Accordingly, thickness of the cladding 30B at the optical fibers 30 is derived and specified in accordance with an intensity of laser light for realizing the resolution that is required for functionality of the exposure apparatus 151.

An intensity C of the laser light that is emitted from the bundled laser emission portion 68 can be found from the following equation:

Intensity $C \leq$ (light amount $W$ emitted from a single laser module×number of modules $n$)÷(optical fiber area $A$×number of optical fibers $N$×packing ratio $P$)

Here, the optical fiber area $A = \pi \times$(core diameter $t \times$ cladding thickness $h$).

The packing ratio $P$=optical fiber area $A$×number of optical fibers $N$÷light emission region area SB.

Further, in this laser device, number of modules $n$=number of optical fibers $N$ Deriving a formula for the required cladding thickness h from the above produces the following equation 1:

$$\text{cladding thickness } h \leq \left( \sqrt{\frac{\text{emission light amount of one laser module } W}{\text{required intensity } C} \times \frac{\text{core}}{\text{packing ratio } P}} - \text{diameter } t \right) \div 2$$

That is, as a technique for setting a high intensity, the present laser device is structured by: plurally providing the pigtail-type laser modules 64 (fiber modules), which serve as laser light sources in which laser light from laser diodes that is incident from one ends, which are incidence ends, of the optical fibers 30 is emitted from the other ends, which are emission ends, of the optical fibers 30; providing the laser emission portion 68, which is structured with a fiber bundle by bundling and integrating the emission end portions of the plurality of optical fibers 30 which lead out from each of the plurality of laser modules 64, for emitting a single emission beam; and setting the thickness h of cladding of each of the optical fibers 30 to a value calculated in accordance with the above equation.

As a result, the etendue of emission light which is provided from the laser emission portion 68 which is structured with a fiber bundle is reduced, and intensity of the laser light source is raised such that high-intensity laser light is emitted from a small area.

Thus, a laser device which is capable of emitting the high-intensity laser beam that is required for performance as a laser light source for raising resolution of the exposure apparatus 151 can be structured.

Further, the optical fibers 30 which lead out from the pigtail-type laser modules 64 need to be fibers which propagate the laser beams without loss. Therefore, a minimum value of the cladding thickness h at these optical fibers 30 is subject to structuring with a thickness which is greater than a region of effusion of evanescent light into the cladding.

In the case of a structure in which the thickness h of the cladding of each optical fiber 30 is set to a value calculated in accordance with equation 1, it is possible to make the thickness h of the cladding of the optical fibers 30 greater than a minimum value thereof, such that a strength of each optical fiber 30 is not lowered more than necessary.

Next, a specific structure will be described for a case in which the exposure apparatus 151 is structured as, for example, a high-precision exposure system with a line spacing of 20 μm, and in which it is required that a beam diameter on the exposure surface is set to not more than 7 μm.

In each laser module 64 in such a case, single-mode laser beams B1 to B7 enter a multi-mode optical fiber with core diameter 50 μm with a coupling efficiency of 0.76. Respective outputs of GaN-based semiconductor lasers at each laser module 64 are 30 mW. Thus, 160 mW (30 mW×7×0.76) multiplexed beams are provided at emission ends of the optical fibers of the modules.

In order to realize high-precision exposure with a line spacing of 20 μm at the exposure apparatus 151, it is required that beam diameters at the photosensitive material are not more than 7 μm. Furthermore, with regard to light output, depending on sensitivity of the photosensitive material, exposure speed and light usage efficiency of an exposure optical system, an output of 4 W is required at the fiber bundle end.

A size of each pixel of the DMD in this exposure apparatus 151 is 13 μm by 13 μm, and the number of pixels that are employed is 128 by 1024. Thus, an illumination area of light from the bundle is 22.2 mm² (1.66 mm×13.31 mm).

The beams with pixel pitch 13 μm from the pixels of the DMD are coupled by a focusing optical system at a face of a microlens array with a focusing distance of 20 μm and a lens pitch of 39 μm, and are focused by the microlenses. An image of this focusing plane is projected onto the photosensitive material surface by an imaging optical system for exposure.

For the focused beam spots to be less than 7 μm, it is necessary that an illumination numerical aperture of the DMD is not more than 0.02. In order to illuminate, via the lens system 67, with an NA of 0.02 or less at this area of the DMD, it is necessary that an illumination area of the laser light at which the NA 0.2 fibers are bundled is not more than 0.22 mm².

In order to provide an output of 4 W, it is necessary to bundle twenty-five of the multi-mode optical fibers (4 W/160 mW=25).

Now, in a case in which a multi-mode optical fiber, of a type which is used in conventional fiber modules, with core diameter 50 μm, cladding diameter 125 μm and NA 0.2 is employed, the area of the light emission region is 0.39 mm² (i.e., an area when multi-mode optical fibers with cladding diameters of 125 μm are formed into a square of five columns and five rows, which is 125 μm×5×125 μm×5=0.39 mm²). Thus, the intensity is 10.24 W/mm² (4 W/0.39 mm²=10.24 W/mm²), which is insufficient with respect to the intensity that is required for the device.

In contrast, when the aforementioned equation 1 is applied, a required cladding thickness of not more than 22 μm (a cladding diameter of 94 μm or less) is found. Considering tolerances of the respective optical elements, a cladding diameter of 80 μm or less is desirable, and more specifically, a cladding diameter of 60 μm or less is more desirable.

Further, if a fiber with core diameter 50 μm and cladding diameter 60 μm is used, the area of the illumination region will be 0.09 mm$^2$ (60 μm×5×60 μm×5=0.09 mm$^2$). Thus, the intensity will be at least four times that in the case in which the conventional fibers with cladding diameter 125 μm are used.

Further, if, for example, the optical fibers 30 in this high-precision exposure system with line spacing 20 μm are set to a core diameter of 30 μm and a cladding diameter of 40 μm, the etendue of the emitted light provided by the laser emission portion 68 that is structured at the fiber bundle will be further reduced, and the laser device can be raised in intensity, with the high-intensity laser light being emitted from an even smaller area.

Next, a technique for appropriately structuring the optical fibers which lead out from the light source 66, which serves as a high-intensity laser device, to be extended over a long distance for use, even in a case in which the cladding thickness of the optical fibers 30 that lead out from the laser modules 64 has been reduced as described above, will be described with reference to FIGS. 10A, 10B and 10C.

As shown in FIG. 10A, in a structure which enables extension of the optical fibers of the high-intensity laser device over a long distance, a predetermined number, for example, seven, of the optical fibers 30 which are structured with a thin cladding thickness h and lead out from seven of the laser modules 64 are bundled, are integrated into a cylindrical form by means of fusion with glass, fixing with solder or the like, and form a connective emission end portion 200 which is structured at the emission end portions of the optical fibers 30.

An incidence end face of a multiplex optical fiber for extension 202 is fixed at an emission end face of this connective emission end portion 200 for connection.

At a portion of connection of the connective emission end portion 200 with the multiplex optical fiber for extension 202, the emission end face of the connective emission end portion 200 is disposed in a state in which a plurality (in this example, seven) of the cores 30A of the optical fibers 30 are bundled. Thus, the multiplexed light beams are emitted through the connective emission end portion 200.

Accordingly, the multiplex optical fiber for extension 202 is structured by an optical fiber with a core diameter of at least the diameter of a circle that could be inscribed to contain the bundled plurality (in this example, seven) of the cores 30A without any portion of the cores 30A extending thereoutside. Furthermore, the multiplex optical fiber for extension 202 is structured by a fiber having an NA (numerical aperture) equal to or greater than the NA of the optical fibers 30 that are disposed at the connective emission end portion 200.

In other words, this connective emission end portion 200 is connected to the incidence end of the multiplex optical fiber for extension 202 which has a core diameter exceeding the area of the bundle that is multiplexed at the connective emission end portion 200 and which has an NA equal to or greater than that of the optical fibers 30 which are employed in the bundle.

This multiplex optical fiber for extension 202 is formed with a length that is required to extend the optical fibers from the light source 66 over a long distance for use. Furthermore, these multiplex optical fibers for extension 202 are provided in a predetermined number for one light source 66, which number is the total number of the laser modules 64 that structure that light source 66 divided by the number of the optical fibers 30 that are bundled at each connective emission end portion 200.

As shown in FIG. 10A, at emission end portions of the predetermined number of multiplex optical fibers for extension 202, the emission end portions (light emission points) of the multiplex optical fibers for extension 202 are arranged in a single row without gaps along the direction intersecting the scanning direction and bundled to structure the laser emission portion 68.

With this technique for appropriately structuring the optical fibers that lead out from the light source 66 to extend over a long distance for use, even in a case in which, because the cladding thickness h has been reduced, the strength of the optical fibers 30 that lead out from the laser modules 64 is low and is insufficient for extension over long distances, extension over long distances is enabled to the extent of the multiplex optical fiber for extension 202, which has large cladding thickness and high strength.

Next, for the technique for appropriately structuring the optical fibers that lead out from the light source 66 to extend over long distances for use, an example of another structure of the connection portion between the connective emission end portion 200 and the incidence end face of the multiplex optical fiber for extension 202 will be described with reference to FIG. 10B.

A connection portion shown in FIG. 10B is structured such that the multiplexed light beams which are emitted from the connective emission end portion 200 are focused by a focusing lens 204 and caused to enter a core 202A of the multiplex optical fiber for extension 202.

In addition, a protective structure is provided at the connection portion shown in FIG. 10B in order to prevent contaminants from adhering to the connective emission end portion 200, the focusing lens 204 and the incidence end portion of the multiplex optical fiber for extension 202 and causing deterioration of laser characteristics.

This protective structure is a structure for preventing contaminants, such as components of organic materials that are decomposed by photochemical reactions, dust in the atmosphere and the like, from adhering at the emission end face of the connective emission end portion 200, the incidence end of the multiplex optical fiber for extension 202 and surfaces of the focusing lens 204 (which is an optical component), in accordance with increases in power and intensity of the laser device emitting high-energy ultraviolet laser light (i.e. as power density increases), and thus adversely affecting laser characteristics.

Accordingly, at the connection portion shown in FIG. 10B, a housing 206 is provided which constitutes a container-like closed structure which encloses the emission end of the connective emission end portion 200, the focusing lens 204 and the incidence end portion of the multiplex optical fiber for extension 202 all together.

The connective emission end portion 200, the focusing lens 204 and the incidence end portion of the multiplex optical fiber for extension 202 that are disposed inside this housing 206 are subjected to metallizing treatments. Gas inside the housing 206 is replaced with an inactive gas, after which the housing 206 is metallically sealed with an unillustrated lid.

The inactive gas which is charged into this housing 206 is desirably nitrogen (purity 99.99%) which contains oxygen with a density of 1 ppm or more and at least one of halogen gases and halide gases.

When the sealed atmosphere includes oxygen with a density of 1 ppm or more, degradation of the laser module can be suppressed. The provision of this degradation-suppression effect is because the oxygen contained in the sealed atmosphere oxidizes and decomposes solids that are generated by photo-decomposition of hydrocarbon compounds. If the oxygen density is less than 1 ppm, the degradation-suppression effect will not be obtained. However, as the oxygen density becomes higher, photochemical reactions with organic silicon compound gases are promoted. Therefore, the oxygen density in the sealed atmosphere is preferably in a range of 1 to 800 ppm and particularly preferably in a range of 1 to 100 ppm.

The halogen gases are chlorine gas ($Cl_2$), fluorine gas $F_2$) and so forth, and the halide gases are gaseous compounds which include halogen atoms such as chlorine atoms (Cl), bromine atoms (Br), iodine atoms (I), fluorine atoms (F) and so forth.

Examples of halide compounds include $CF_3Cl$, $CF_2Cl_2$, $CFCl_3$, $CF_3Br$, $CCl_4$, $CCl_4$—$O_2$, $C_2F_4Cl_2$, $Cl$—$H_2$, $PCl_3$, $CF_4$, $SF_6$, $NF_3$, $XeF_2$, $C_3F_8$, $CHF_3$ and the like. However, compounds of fluorine or chlorine with carbon (C), nitrogen (N), sulphur (S), and xenon (Xe) are preferable, and compounds including fluorine atoms are particularly preferable.

A degradation-suppression effect is exhibited even by a tiny amount of halogen gas. However, in order to obtain a significant degradation-suppression effect, it is preferable to set an inclusion density of halogen gas to 1 ppm or more. This degradation-suppression effect is provided by the halogen gas included in the sealed atmosphere decomposing deposits that are caused by photo-decomposition of organic silicon compound gases.

If a material having reactivity with respect to the halogen gas, such as a compound of silicon (Si), molybdenum (Mo), chromium (Cr), Tin (Sn) or zirconium (Zr), a nitride or the like, is employed as a surfacemost material covering the optical components, the surfacemost layers of these optical components will be etched, and reliability of the module will be reduced.

Therefore, at surfacemost layers of the connective emission end portion 200, the focusing lens 204 and the incidence end portion of the multiplex optical fiber for extension 202 that are exposed to the sealed atmosphere, it is preferable to use a material which is inactive with respect to the halogen gas, such as, for example, an oxide or nitride of indium (In), gallium (Ga), aluminium (Al), titanium (Ti) and tantalum (Ta).

Further, although not illustrated, an air circulation apparatus may be installed at the housing 206. This air circulation apparatus has a structure which is provided, at piping which draws the inactive gas out through an exhaust aperture provided at the housing 206 and continues to a supply aperture provided at the housing 206, with a filter, a pump and a valve. The filter removes contaminants, the pump circulates the inactive gas, and the valve regulates supply of the gas from a gas storage cylinder.

For this filter, it is preferable to use a filter which is charged with an adsorbent. As the adsorbent, a zeolite adsorbent, active carbon, or both a zeolite adsorbent and active carbon can be used. ZEOLUM F9 HA, produced by Tosoh Corporation, is a preferable zeolite adsorbent. This ZEOLUM F9 HA is formed with a crystalline hydrous aluminosilicate of an alkali metal or alkaline earth metal ($Me/x.Al_2O_3.mSiO_2.nH_2O$: where Me is a metallic ion with valency x). It is desirable to determine the amount of the zeolite adsorbent with consideration to volume of the system, the contaminants that will be deposited and adsorbence capacity of the adsorbent. The filter is not limited to zeolite type adsorbents; adsorbents which are formed with other compositions can be used.

Further still, a catalyst such as Pt, Pd or the like may be added in the filter which is charged with the adsorbent, and the filter may be heated to, for example, 500° C. so as to decompose hydrocarbon compounds.

It is also possible to adhere an adsorbent, with inorganic or organic adhesive, at locations in the housing 206 that are not on optical paths of the laser beams, as a means for eliminating contaminants.

Next, for the technique for appropriately structuring the optical fibers that lead out from the light source 66 to extend over long distances for use, an example of yet another structure of the connection portion between the connective emission end portion 200 and the incidence end face of the multiplex optical fiber for extension 202 will be described with reference to FIG. 10C.

Figure 10C:
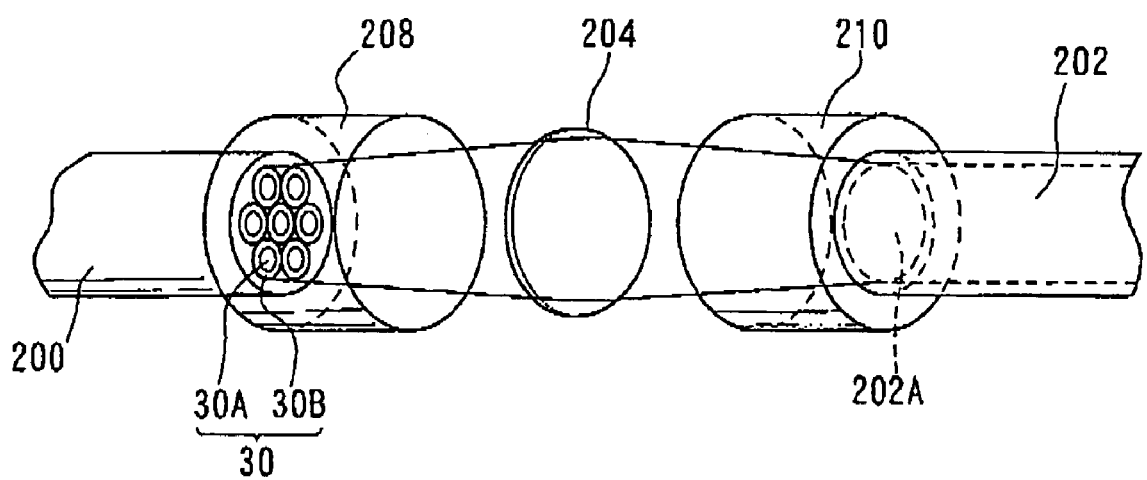
FIG. 10C is an enlarged sectional view showing another example of structure at a connection portion between a connective emission end portion and a multiplex optical fiber for extension in a fiber light source which is used at the laser device relating to the embodiment of the invention.

The connection portion shown in FIG. 10C is structured by fusingly providing a first transparent member 208 at the end face of the connective emission end portion 200 and fusingly providing a second transparent member 210 at the incidence end face of the multiplex optical fiber for extension 202. Thus, the multiplexed light beams which are emitted from the connective emission end portion 200 pass through the first transparent member 208, are then focused by the focusing lens 204, and are caused to enter the core 202A of the multiplex optical fiber for extension 202 after passing through the second transparent member 210.

The first transparent member 208 and the second transparent member 210 constitute protective structures which prevent contaminants from adhering at the emission end face of the connective emission end portion 200 and the incidence end face of the multiplex optical fiber for extension 202, respectively, and causing deterioration of laser characteristics.

The first transparent member 208 and second transparent member 210 which serve as protective structures are each formed of transparent glass or formed of transparent plastic. At opposite sides of the first transparent member 208 and second transparent member 210 from faces thereof that are to be fixed to, respectively, the emission end face of the connective emission end portion 200 and the incidence end face of the multiplex optical fiber for extension 202, faces of the other ends of the first transparent member 208 and second transparent member 210 serve as emission windows. The first transparent member 208 and second transparent member 210 are formed as transparent bodies which are shaped to have sizes sufficient to allow widening of the laser beams beyond outer diameters of the connective emission end portion 200 and the multiplex optical fiber for extension 202 (and in the present embodiment, are formed in cylindrical shapes).

The emission end face of the connective emission end portion 200, the incidence end face of the multiplex optical fiber for extension 202, an incidence face of the first transparent member 208 and an emission face of the second transparent member 210 are each subjected to end-face coating so as to be non-reflective with respect to oscillation wavelengths of the multiplexed laser beams, and are structured so as to prevent reflection by air layers and thus raise beam transmissivity.

In a case of a structure in which a required thickness of the first transparent member 208 is, for example, around 2 mm, an angle of the laser beams from the emission end face of the connective emission end portion 200 to the emission end face of the first transparent member 208 is 16.5°. Therefore, a laser beam diameter at the emission end face of the first transparent member 208 is broadened, and power density is reduced to around a thousandth in comparison to the laser beams at the emission end face of the connective emission end portion 200. As a consequence, the adherence of contaminants such as components of organic materials that are decomposed by photochemical reactions, dust in the atmosphere and the like at the emission end face of the first transparent member 208 and the deterioration of laser characteristics can be avoided.

Moreover, because the diameter of a laser beam that has been focused by the focusing lens 204 and is about to enter the incidence end face of the second transparent member 210 is broad and power density thereof is lowered, the adherence of contaminants such as components of organic materials that are decomposed by photochemical reactions, dust in the atmosphere and the like at the incidence end face of the second transparent member 210 and the deterioration of laser characteristics can be avoided.

Next, a specific structural example of the laser module 64, which is structured to serve as a multiplexed laser light source (a fiber light source), will be described with reference to FIG. 11.

This multiplex laser light source is structured with a plurality (for example, seven) of chip-form lateral multi-mode or single-mode GaN-based semiconductor lasers LD1, LD2, LD3, LD4, LD5, LD6 and LD7, collimator lenses 11, 12, 13, 14, 15, 16 and 17, a single condensing lens 20, and one of the multi-mode optical fibers 30. The GaN-based semiconductor lasers LD1 to LD7 are fixedly arranged on a heat block 10. The collimator lenses 11 to 17 are provided in correspondence with the GaN-based semiconductor lasers LD1 to LD7, respectively.

Note that the number of semiconductor lasers is not limited to seven. For example, with a multi-mode optical fiber with cladding diameter=60 μm, core diameter=50 μm and NA=0.2, it is possible for the light of as many as twenty semiconductor lasers to be incident therein, and it is possible to realize an illumination head with a required light amount while further reducing the number of optical fibers.

As the GaN-based semiconductor lasers LD1 to LD7, lasers may be utilized which are provided with an oscillation wavelength different from the aforementioned 405 nm, in a wavelength range of 350 nm to 450 nm.

The laser module 64 may be structured with one or a plurality of multi-mode lasers replacing the GaN-based semiconductor lasers LD1 to LD7. Such a case may be structured such that, for example, four multi-mode lasers structured with excitation layer widths of 8 μm are arranged so as to irradiate at the 50-μm core. Further, the laser module 64 may be structured by replacing all seven of the GaN-based semiconductor lasers LD1 to LD7 with a single multi-mode laser, for example, a multi-mode laser with an excitation layer width of 15 μm, and replacing the optical fiber 30 with an optical fiber with a narrower core diameter, for example, with a core diameter of 20 μm and a cladding diameter of 30 μm.

Figure 12:
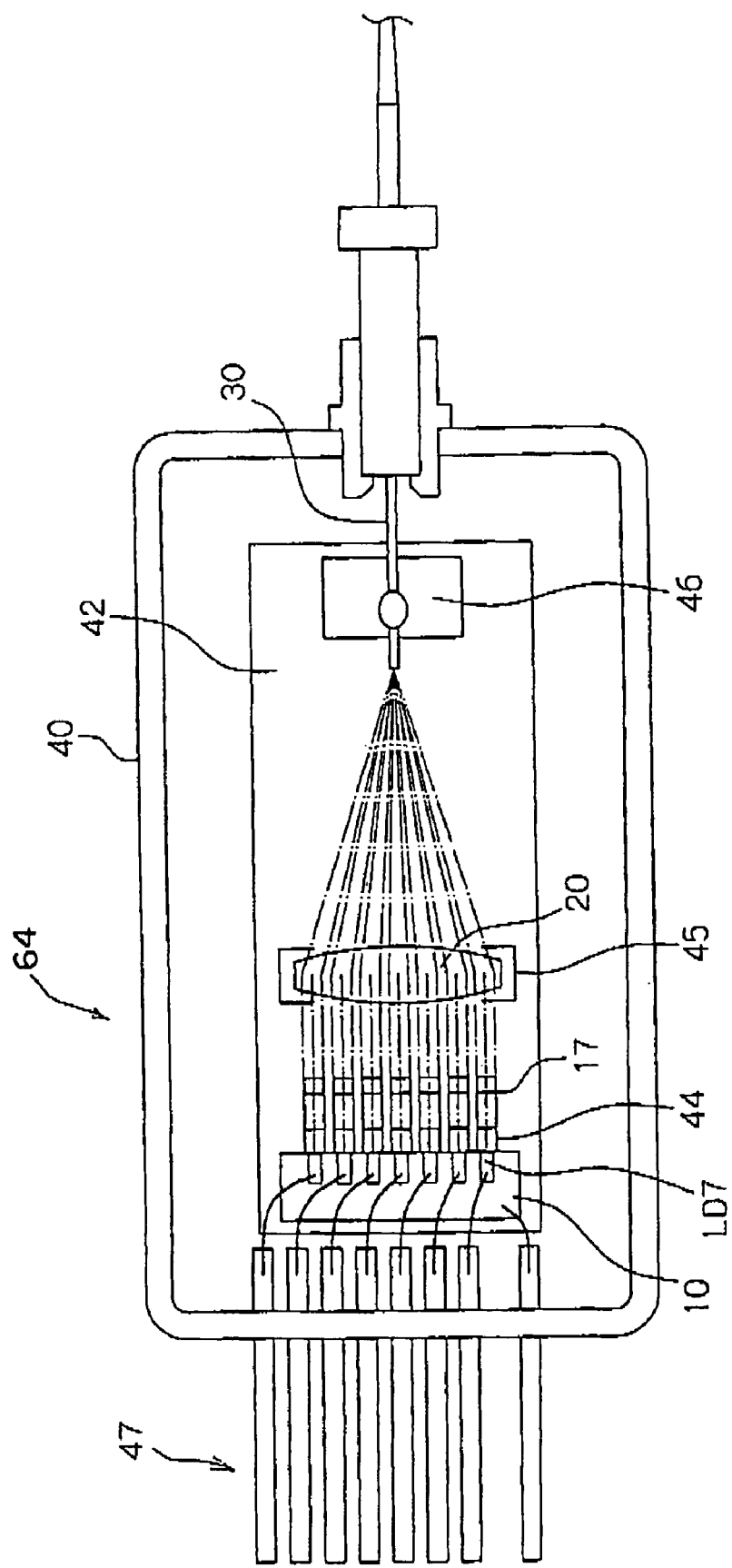
FIG. 12 is a plan view showing structure of a laser module which is used in the laser device relating to the embodiment of the invention.
Figure 13:
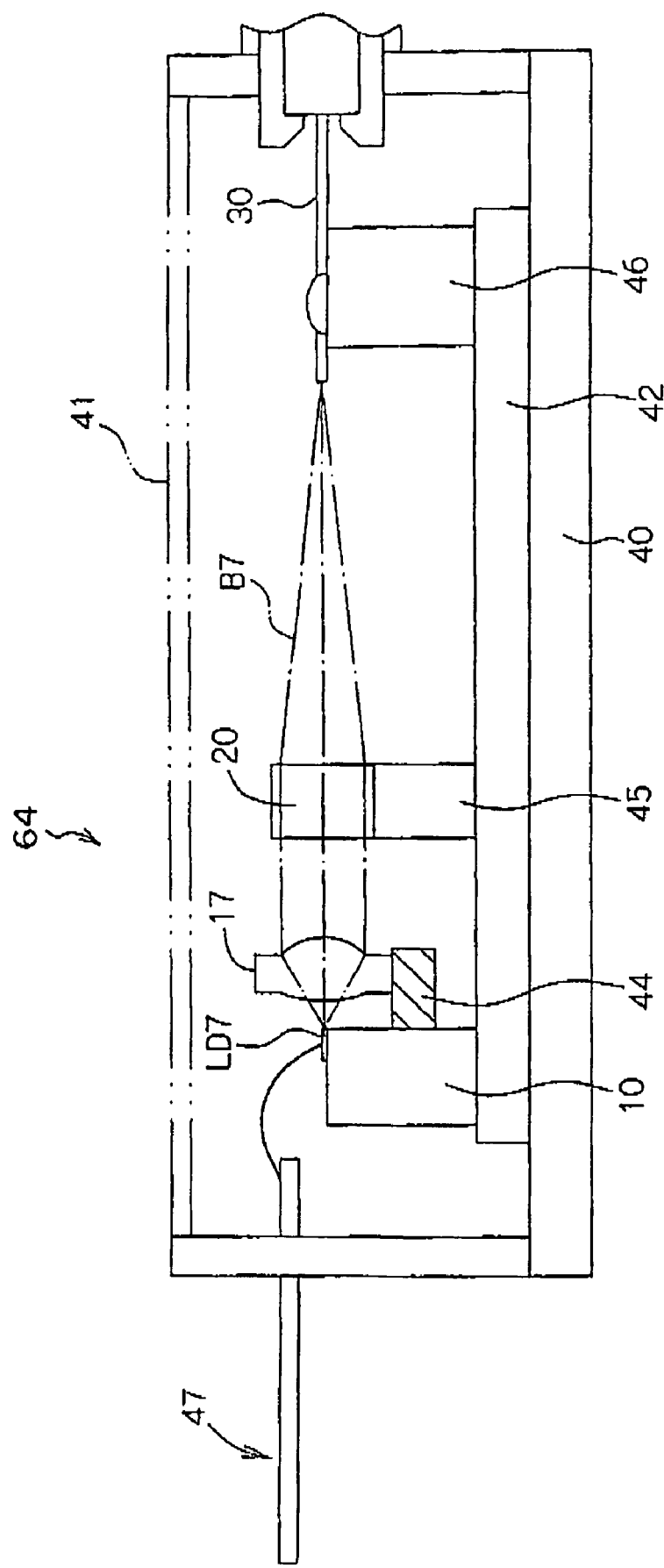
FIG. 13 is a side view showing structure of the laser module shown in FIG. 12.

As shown in FIGS. 12 and 13, the above-described multiplex laser light source, together with other optical elements, is accommodated in a box-like package 40 which opens upward. The package 40 is provided with a package lid 41 prepared so as to close the opening of the package 40. After an air removal treatment, a sealed gas is introduced and the opening of the package 40 is closed by the package lid 41. Thus, the above-described multiplex laser light source is hermetically sealed in a closed space formed by the package 40 and the package lid 41.

A baseplate 42 is fixed at a lower face of the package 40. The heat block 10, a condensing lens holder 45 and a fiber holder 46 are attached at an upper face of the baseplate 42. The condensing lens holder 45 retains the condensing lens 20. The fiber holder 46 retains an incidence end portion of the multi-mode optical fiber 30. An opening is formed in a wall face of the package 40. An emission end portion of the multi-mode optical fiber 30 is led out through this opening to outside the package.

A collimator lens holder 44 is attached at a side face of the heat block 10, and retains the collimator lenses 11 to 17. Openings are formed in a lateral wall face of the package 40. Wiring 47, which supplies driving current to the GaN-based semiconductor lasers LD1 to LD7, is passed through these openings and led out to outside the package.

Note that in FIG. 12, in order to alleviate complexity of the drawing, of the plurality of GaN-based semiconductor lasers, only the GaN-based semiconductor laser LD7 is marked with a reference numeral, and of the plurality of collimator lenses, only the collimator lens 17 is marked with a reference numeral.

Figure 14:
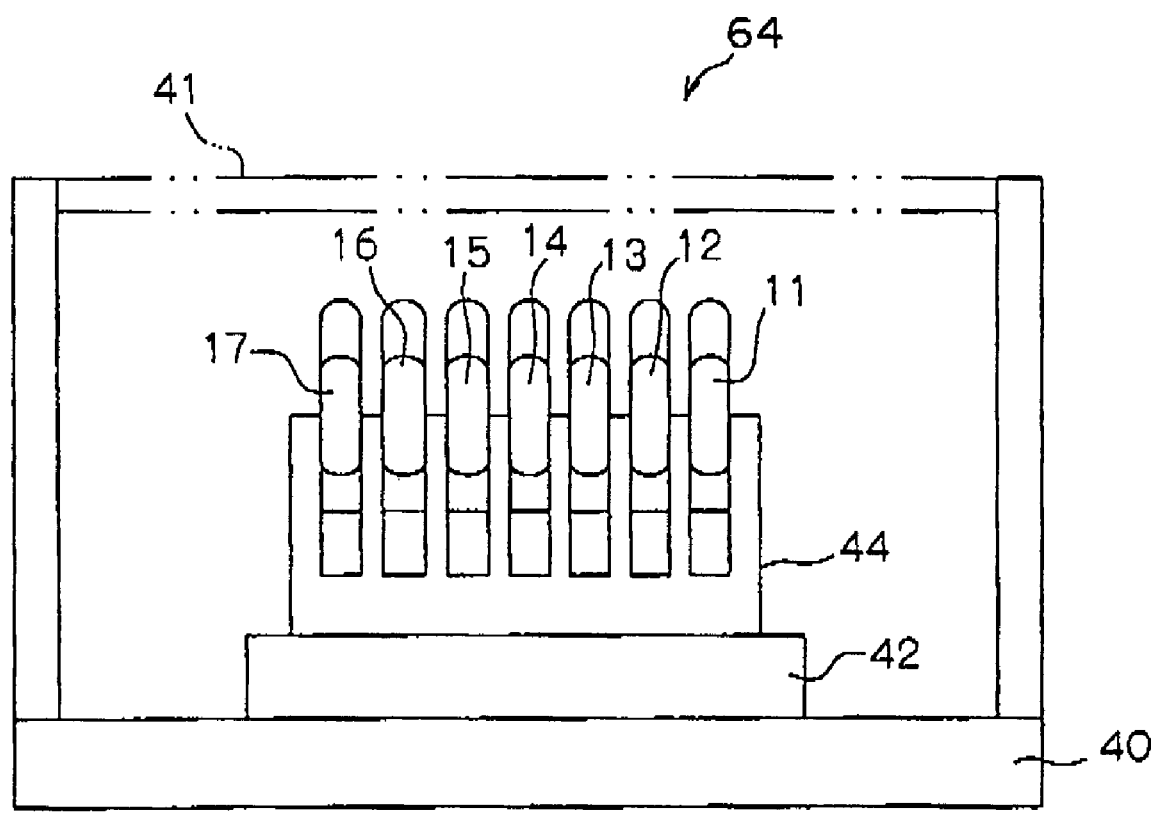
FIG. 14 is a side view of principal portions showing structure of the laser module shown in FIG. 12.

FIG. 14 shows the collimator lenses 11 to 17 and mounting portions thereof, as viewed from front faces thereof. Each of the collimator lenses 11 to 17 has a long, narrow, cut-down shape with parallel flat faces defining a region that includes an optical axis of a circular-form lens which is provided with an aspherical surface The collimator lenses with this long, narrow shape may be formed by, for example, molding-formation of resin or optical glass. The collimator lenses 11 to 17 are closely disposed in a direction of arrangement of light emission points of the GaN-based semiconductor lasers LD1 to LD7 (the left-right direction in FIG. 14) such that the length directions of the collimator lenses 11 to 17 cross the direction of arrangement of the light emission points.

As the GaN-based semiconductor lasers LD1 to LD7, lasers are employed which are provided with an active layer with a light emission width of 2 μm, and which respectively emit laser beams B1 to B7 in forms which widen at angles of, for example, 10° and 30° with respect, respectively, to a direction parallel to the active layers and a direction perpendicular to the active layers. These GaN-based semiconductor lasers LD1 to LD7 are disposed such that the light emission points thereof are lined up in a single row in the direction parallel to the active layers.

Accordingly, the laser beams B1 to B7 emitted from the respective light emission points are irradiated to, respectively, the collimator lenses 11 to 17 having the long, narrow forms described above, in states in which the direction for which the spreading angle of the beam is greater coincides with the length direction of the lens and the direction in which the spreading angle is smaller coincides with a width direction of the lens (a direction intersecting the length direction).

The condensing lens 20 is cut away in a long, narrow shape with parallel flat faces defining a region that includes an optical axis of a circular-form lens which is provided with an aspherical surface, and is formed in a shape which is long in the direction of arrangement of the collimator lenses 11 to 17 (i.e., the horizontal direction) and short in a direction perpendicular thereto. The condensing lens 20 is also formed by, for example, molding-formation of resin or optical glass.

(Operation of Exposure Apparatus)

Next, operation of the exposure apparatus 151 described above will be described.

At each exposure head 166 of the scanner 162, the respective laser beams B1, B2, B3, B4, B5, B6 and B7, which are emitted in divergent forms from the respective GaN-based semiconductor lasers LD1 to LD7 that structure the multiplex laser light sources of the fiber light source 66, are converted to parallel light by the corresponding collimator lenses 11 to 17, as shown in FIG. 11. The laser beams B1 to B7 that have been collimated are focused by the condensing lenses 20, and converge at the incidence end faces of the cores 30A of the multi-mode optical fibers 30.

In the present embodiment, a condensing optical systems is structured by the collimator lenses 11 to 17 and the condensing lens 20, and a multiplexing optical system is structured by the condensing optical system and the multi-mode optical fiber 30. Thus, the laser beams B1 to B7 focused by the condensing lenses 20 as described above enter the cores 30A of the multi-mode optical fibers 30, are propagated in the optical fibers, multiplexed to single laser beams B, and emitted from the multi-mode optical fibers 30.

At this exposure apparatus 151, image data corresponding to an exposure pattern is inputted at the controller 51 connected to the DMD 50, and is temporarily stored in a frame memory in the controller. This image data is data which represents a density of each pixel structuring an image with a binary value (whether or not a dot is to be recorded).

The stage 152, to which the surface of the photosensitive material 150 is attracted by suction, is moved along the guides 158 at a constant speed by the unillustrated driving apparatus, from an upstream side of the gate 160 to a downstream side thereof. When the stage 152 is passing under the gate 160, and the leading end of the photosensitive material 150 has been detected by the detection sensors 164 mounted at the gate 160, the image data stored in the frame memory is read out in sequence as a plurality of line portion units, and control signals for each of the exposure heads 166 are generated on the basis of the image data read from the data processing section. Hence, the micromirrors of the DMDs 50 at the respective exposure heads 166 are respectively switched on and off by the mirror driving control section in accordance with the control signals that have been generated.

When laser light is irradiated from the fiber array light source 66 to the DMD 50, if a micromirror of the DMD 50 is in the ON state, the reflected laser light is focused on the exposure surface 56 of the photosensitive material 150 by the lens systems 54 and 58. Thus, the laser light emitted from the fiber light source 66 is turned on or off at each pixel, and the photosensitive material 150 is exposed in a unit (the exposure area 168) with a number of pixels substantially the same as the number of pixels employed at the DMD 50. As the photosensitive material 150 is moved together with the stage 152 at the constant speed, the photosensitive material 150 is scanned in a direction opposite to the stage movement direction by the scanner 162, and the strip-form exposed regions 170 are formed at the respective exposure heads 166.

When scanning of the photosensitive material 150 by the scanner 162 has been completed and the trailing end of the photosensitive material 150 has been detected by the detection sensors 164, the stage 152 is driven back along the guides 158 by the unillustrated driving apparatus, to a start point at an upstream-most side of the gate 160, and is again moved along the guides 158, at the constant speed, from the upstream side to the downstream side of the gate 160.

As described above, the exposure apparatus of the present embodiment is provided with exposure heads which illuminate spatial light modulation devices with fiber light sources at which emission end portions of optical fibers (light emission points) of multiplex laser light sources are arranged in arrays. At these fiber light sources, cladding diameters of emission ends of the optical fibers are set to be smaller to the extent of a required diameter. Consequently, light emission portion diameters can be made smaller, and a rise in intensity of the fiber light sources is enabled. As a result, deeper focusing depths can be provided, and high-speed, high-precision exposure is enabled. Therefore, the exposure apparatus of the present embodiment can be used for processes of exposing thin-film transistors (TFT) and the like, for which high intensity is required.

As is described above, with the laser device of the present invention, there are effects in that a high intensity which is required for raising precision of performance of an exposure apparatus is provided, and a structure capable of emitting high-intensity laser light is possible.

What is claimed is:

1. A laser device comprising:
   laser elements;
   optical fibers each including cladding surrounding a core, and including an incidence end and an emission end portion; and
   a laser emission portion at which emission end portions of a plurality of the optical fibers are arranged in the form of a bundle and integrated for emitting a single emission beam, the laser emission portion being provided with a plurality of laser modules that include condensing optical systems which focus laser beams emitted from the laser elements and cause the laser beams to enter through incidence ends of the optical fibers,
   wherein a thickness h of the cladding of each of the plurality of optical fibers is set to a value calculated in accordance with the following equation:

$$\text{cladding thickness } h \leq \left( \sqrt{\frac{\text{emission light amount of one laser module } W}{\text{required intensity } C \times \text{packing ratio } P}} - \text{core diameter } t \right) \div 2.$$

2. The laser device of claim 1, wherein an arrangement of the bundled emission end portions is determined on the basis of shapes of beam spots that are to be projected at an object of exposure.

3. The laser device of claim 1, wherein the optical fibers each comprise one selected from the group consisting of step index-type optical fibers, graded index-type optical fibers and multiplex-type optical fibers.

4. The laser device of claim 1, wherein a cladding diameter of the optical fibers is between 10 μm and 80 μm.

5. The laser device of claim 1, wherein a cladding diameter of the optical fibers is between 10 μm and 60 μm.

6. The laser device of claim 1, wherein a cladding diameter of the optical fibers is between 10 μm and 40 μm.

* * * * *